(12) United States Patent
Nakayama et al.

(10) Patent No.: US 10,500,853 B2
(45) Date of Patent: Dec. 10, 2019

(54) PIEZOELECTRIC DEVICE, LIQUID EJECTING HEAD, AND LIQUID EJECTING APPARATUS

(71) Applicant: SEIKO EPSON CORPORATION, Tokyo (JP)

(72) Inventors: Masao Nakayama, Shiojiri (JP); Eiju Hirai, Azumino (JP); Naoto Yokoyama, Matsumoto (JP); Motoki Takabe, Shiojiri (JP); Yoichi Naganuma, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/954,860

(22) Filed: Apr. 17, 2018

(65) Prior Publication Data

US 2018/0297363 A1    Oct. 18, 2018

(30) Foreign Application Priority Data

Apr. 18, 2017  (JP) .................................. 2017-082229
Jan. 26, 2018  (JP) .................................. 2018-011732

(51) Int. Cl.
  *B41J 2/045*    (2006.01)
  *B41J 2/14*     (2006.01)
  (Continued)

(52) U.S. Cl.
  CPC ............ *B41J 2/14201* (2013.01); *B41J 2/045* (2013.01); *B41J 2/14233* (2013.01); *B41J 2002/14241* (2013.01); *B41J 2002/14419* (2013.01); *B41J 2202/11* (2013.01); *H01L 41/0477* (2013.01); *H01L 41/0478* (2013.01);
  (Continued)

(58) Field of Classification Search
  None
  See application file for complete search history.

(56) References Cited

U.S. PATENT DOCUMENTS 9,475,289 B2 *  10/2016  Yazaki ................ B41J 2/14233
2002/0080213 A1   6/2002  Shimada et al.
(Continued)

FOREIGN PATENT DOCUMENTS

JP  2000-094688 A    4/2000
JP  2009-160841 A    7/2009
(Continued)

*Primary Examiner* — Matthew Luu
*Assistant Examiner* — Tracey M McMillion
(74) *Attorney, Agent, or Firm* — Workman Nydegger

(57) ABSTRACT

A piezoelectric device including a pressure chamber, a piezoelectric element, and a vibration plate, in which the piezoelectric element is provided with a first electrode, a second electrode, and a piezoelectric layer, the vibration plate has a first portion overlapping the piezoelectric element and a second portion having a thickness smaller than that of the first portion and overlapping an inner peripheral surface of a side wall of the pressure chamber, a side surface of the piezoelectric element which intersects the vibration plate has a first surface inclined at a first angle, the vibration plate has a second surface, between the first portion and the second portion, inclined at a second angle smaller than the first angle, and an end portion of the second surface on the side wall side of the pressure chamber overlaps the side wall of the pressure chamber.

20 Claims, 9 Drawing Sheets

(51) Int. Cl.
    *H01L 41/047*    (2006.01)
    *H01L 41/29*     (2013.01)
    *H01L 41/09*     (2006.01)
    *H01L 41/187*    (2006.01)
    *H01L 41/332*    (2013.01)
    *H01L 41/053*    (2006.01)

(52) U.S. Cl.
    CPC ...... *H01L 41/0533* (2013.01); *H01L 41/0973* (2013.01); *H01L 41/1876* (2013.01); *H01L 41/29* (2013.01); *H01L 41/332* (2013.01)

(56) References Cited

U.S. PATENT DOCUMENTS

| | | |
|---|---|---|
| 2006/0203041 A1 | 9/2006 | Shimada et al. |
| 2014/0267504 A1 | 9/2014 | Ohashi et al. |
| 2015/0224771 A1 | 8/2015 | Hirai et al. |
| 2015/0360469 A1 | 12/2015 | Hirai et al. |
| 2016/0229182 A1 | 8/2016 | Hirai et al. |

FOREIGN PATENT DOCUMENTS

| | | |
|---|---|---|
| JP | 2014-175577 A | 9/2014 |
| JP | 2015-150713 A | 8/2015 |

\* cited by examiner

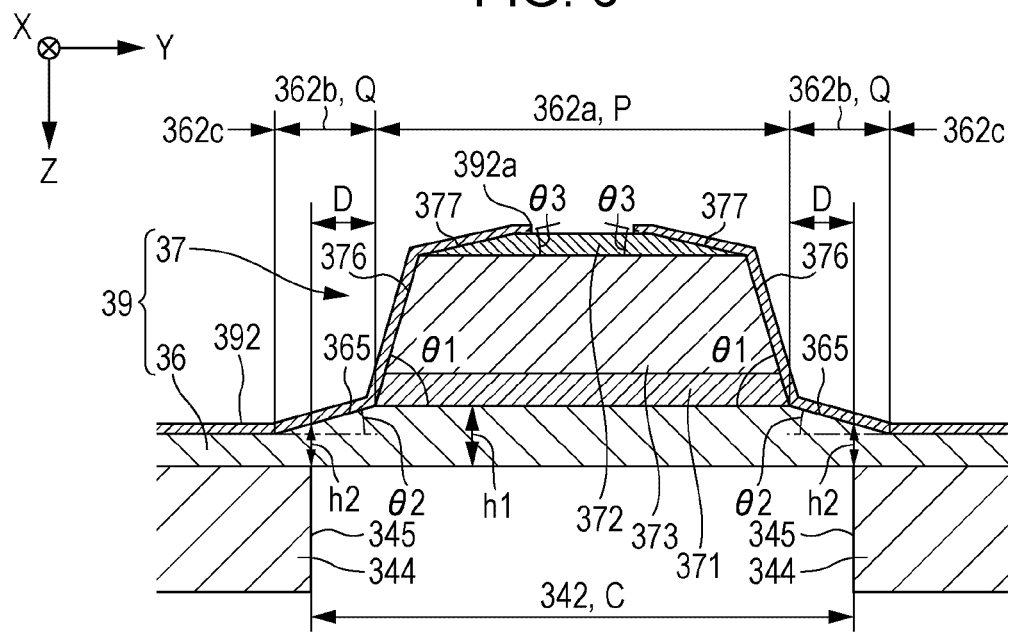
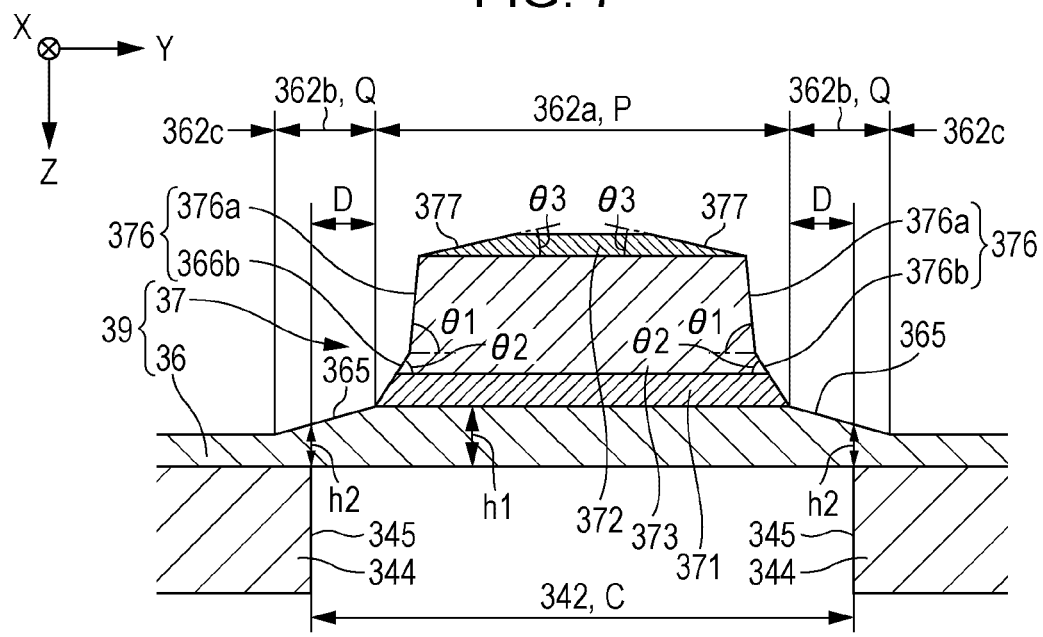

PIEZOELECTRIC DEVICE, LIQUID EJECTING HEAD, AND LIQUID EJECTING APPARATUS

The entire disclosure of Japanese Patent Application No. 2017-082229, filed Apr. 18, 2017 and 2018-011732, filed Jan. 26, 2018 are expressly incorporated by reference herein.

BACKGROUND

1. Technical Field

The present invention relates to a technique for ejecting a liquid such as ink.

2. Related Art

In the related art, there is proposed a liquid ejecting head in which a piezoelectric device generates pressure variations in a pressure chamber to eject a liquid, such as ink supplied to the pressure chamber, from a nozzle. For example, JP-A-2014-175577 discloses a technique in which a piezoelectric device, which is provided with a vibration plate forming a wall surface (upper surface) of a pressure chamber and a piezoelectric element vibrating the vibration plate, is provided for each pressure chamber. The piezoelectric element of JP-A-2014-175577 is formed by forming a piezoelectric layer between a first electrode extending over a plurality of piezoelectric elements and second electrodes individually formed for each piezoelectric element. According to such a piezoelectric device, the piezoelectric layer is deformed by the piezoelectric effect corresponding to the electric field between the first electrode and the second electrode to vibrate the vibration plate, making it possible to generate pressure variations in the pressure chamber.

In the piezoelectric device of JP-A-2014-175577, as the vibration plate or the first electrode is made thinner, the region overlapping the piezoelectric element (piezoelectric layer) in a plan view is larger and more easily deformed, thus it is possible to improve the displacement characteristics of the piezoelectric device. However, when the thickness of the first electrode or the vibration plate is made thin as a whole, the region of the piezoelectric device overlapping the piezoelectric element (piezoelectric layer) in a plan view is thick, and the region which does not overlap is thin, thus, there is a concern that stress will tend to concentrate at the boundary of these regions and the piezoelectric device will be damaged (burned).

SUMMARY

An advantage of some aspects of the invention is to alleviate stress concentration while improving displacement characteristics.

According to an aspect of the invention, there is provided a piezoelectric device including a pressure chamber, a piezoelectric element, and a vibration plate arranged between the pressure chamber and the piezoelectric element and forming a wall surface which intersects a side wall of the pressure chamber, in which the piezoelectric element is provided with a first electrode on the vibration plate side, a second electrode on an opposite side of the vibration plate with respect to the first electrode, and a piezoelectric layer interposed between the first electrode and the second electrode, the vibration plate has a first portion overlapping the piezoelectric element in a plan view and a second portion having a thickness smaller than that of the first portion and overlapping an inner peripheral surface of a side wall of the pressure chamber in a plan view, a side surface of the piezoelectric element which intersects the vibration plate has a first surface inclined at a first angle with respect to a surface of the vibration plate on the pressure chamber side, the vibration plate has a second surface inclined at a second angle smaller than the first angle with respect to the surface of the vibration plate on the pressure chamber side between the first portion and the second portion, and an end portion of the second surface on the side wall side of the pressure chamber overlaps the side wall of the pressure chamber in a plan view. Accordingly, since the thickness of the vibration plate is thinner in the second portion overlapping an inner peripheral surface of the side wall of the pressure chamber in a plan view than in the first portion (active portion) overlapping the piezoelectric element in a plan view, the thickness of a portion (arm portion) supporting the first portion between the first portion and the second portion is thin. Therefore, since the first portion is easily displaced, it is possible to improve the displacement characteristics. Furthermore, in this case, the second angle which is the inclination angle of the second surface of the vibration plate is smaller than the first angle which is the inclination angle of the first surface of the piezoelectric element. Since the first surface of the piezoelectric element and the second surface of the vibration plate make it possible to make changes in the thickness of the piezoelectric device gentle from the side surface of the piezoelectric element to the vicinity of the boundary where stress concentration is likely to occur between the piezoelectric element and the vibration plate, it is possible to alleviate the stress concentration. Thus, in this case, it is possible to alleviate the stress concentration while improving the displacement characteristics. Moreover, in this case, since the end portion of the second surface on the side wall side of the pressure chamber overlaps the side wall of the pressure chamber in a plan view, the end portion of the second surface of the vibration plate is not displaced. Therefore, in this case, it is possible to alleviate the stress concentration even at the end portion of the second surface of the vibration plate where the stress tends to concentrate if displacement occurs.

According to another aspect of the invention, there is provided a piezoelectric device including a pressure chamber, a piezoelectric element, and a vibration plate arranged between the pressure chamber and the piezoelectric element and forming a wall surface which intersects a side wall of the pressure chamber, in which the piezoelectric element is provided with a first electrode on the vibration plate side, a second electrode on an opposite side of the vibration plate with respect to the first electrode, and a piezoelectric layer interposed between the first electrode and the second electrode, the first electrode has a first portion overlapping the piezoelectric layer in a plan view and a second portion having a thickness smaller than that of the first portion and overlapping an inner peripheral surface of a side wall of the pressure chamber in a plan view, and a side surface of the piezoelectric layer which intersects the first electrode has a first surface inclined at a first angle with respect to a surface of the vibration plate on the pressure chamber side, the first electrode has a second surface, between the first portion and the second portion, inclined at a second angle smaller than the first angle with respect to a surface of the vibration plate on the pressure chamber side, and an end portion of the second surface on a side wall side of the pressure chamber overlaps a side wall of the pressure chamber in a plan view. Accordingly, since the thickness of the first electrode is thinner in the second portion which overlaps the inner peripheral surface of the side wall of the pressure chamber in a plan view than in the first portion (active portion) overlapping the piezoelectric layer in a plan view, the thickness of the portion (arm portion) supporting the first portion between the first portion and the second portion is thin. Therefore, since the first portion is easily displaced, it is possible to improve the displacement characteristics. Furthermore, in this case, the second angle which is the inclination angle of the second surface of the first electrode is smaller than the first angle which is the inclination angle of the first surface of the piezoelectric layer. Since the first surface of the piezoelectric layer and the second surface of the first electrode make it possible to make changes in the thickness of the piezoelectric device gentle from the side surface of the piezoelectric element to the vicinity of the boundary where stress concentration is likely to occur between the piezoelectric element and the vibration plate, it is possible to alleviate the stress concentration. In this case, it is possible to alleviate the stress concentration while improving the displacement characteristics. In addition, in this case, since the end portion of the second surface on the side wall side of the pressure chamber overlaps the side wall of the pressure chamber in a plan view, the end portion of the second surface of the first electrode is not displaced. Therefore, in this case, it is possible to alleviate the stress concentration even at the end portion of the second surface of the first electrode where the stress easily concentrates if displacement occurs.

According to still another aspect of the invention, there is provided a piezoelectric device including a pressure chamber, a piezoelectric element, and a vibration plate arranged between the pressure chamber and the piezoelectric element and forming a wall surface which intersects a side wall of the pressure chamber, in which the piezoelectric element is provided with a first electrode on the vibration plate side, a second electrode on an opposite side of the vibration plate with respect to the first electrode, and a piezoelectric layer interposed between the first electrode and the second electrode, the first electrode has a first portion overlapping the piezoelectric layer in a plan view and a second portion with a thickness thinner than that of the first portion and overlapping an inner peripheral surface of the side wall of the pressure chamber in a plan view, a side surface of the piezoelectric layer which intersects the first electrode has a first surface inclined at a first angle with respect to a surface of the vibration plate on the pressure chamber side, the first electrode has a second surface, between the first portion and the second portion, inclined at a second angle smaller than the first angle with respect to a surface of the vibration plate on the pressure chamber side, and the end portion of the second surface on the side wall side of the pressure chamber overlaps the side wall of the pressure chamber in a plan view. Accordingly, since the thickness of the first electrode is thinner in the second portion overlapping an inner peripheral surface of the side wall of the pressure chamber in a plan view than in the first portion (active portion) overlapping the piezoelectric layer in a plan view, the thickness of the portion (arm portion) supporting the first portion is thin between the first portion and the second portion. Therefore, since the first portion is easily displaced, it is possible to improve the displacement characteristics. Furthermore, in this case, the second angle which is the inclination angle of the second surface of the first electrode is smaller than the first angle which is the inclination angle of the first surface of the piezoelectric layer. Since the first surface of the piezoelectric layer and the second surface of the first electrode make it possible to make changes in the thickness of the piezoelectric device gentle from the side surface of the piezoelectric element to the vicinity of the boundary where stress concentration is likely to occur between the piezoelectric element and the vibration plate, it is possible to alleviate the stress concentration. Thus, in this case, it is possible to alleviate the stress concentration while improving the displacement characteristics.

According to still another aspect of the invention, there is provided a piezoelectric device including a pressure chamber, a piezoelectric element, and a vibration plate arranged between the pressure chamber and the piezoelectric element and forming a wall surface which intersects a side wall of the pressure chamber, in which the piezoelectric element is provided with a first electrode on the vibration plate side, a second electrode on an opposite side of the vibration plate with respect to the first electrode, and a piezoelectric layer interposed between the first electrode and the second electrode, the first electrode has a first portion overlapping the piezoelectric layer in a plan view and a second portion with a thickness thinner than that of the first portion and overlapping an inner peripheral surface of the side wall of the pressure chamber in a plan view, and a side surface of the piezoelectric layer which intersects the first electrode has a first surface inclined at a first angle with respect to a surface of the vibration plate on the pressure chamber side, and a second surface inclined at a second angle smaller than the first angle. Accordingly, since the thickness of the first electrode is thinner in the second portion overlapping an inner peripheral surface of the side wall of the pressure chamber in a plan view than in the first portion (active portion) overlapping the piezoelectric layer in a plan view, the thickness of the portion (arm portion) supporting the first portion is thin between the first portion and the second portion. Therefore, since the first portion is easily displaced, it is possible to improve the displacement characteristics. Furthermore, in this case, the second angle which is the inclination angle of the second surface of the piezoelectric layer is smaller than the first angle which is the inclination angle of the first surface. Since the first surface and the second surface of the piezoelectric layer make it possible to make changes in the thickness of the piezoelectric device gentle from the side surface of the piezoelectric layer to the vicinity of the boundary where stress concentration is likely to occur between the piezoelectric element and the vibration plate, it is possible to alleviate the stress concentration. Thus, in this case, it is possible to alleviate the stress concentration while improving the displacement characteristics.

The second electrode may have a third surface inclined at a third angle with respect to a surface of the vibration plate on the pressure chamber side, and the third angle is smaller than the second angle. Accordingly, since the second electrode has the third surface inclined at the third angle with respect to the surface of the vibration plate on the pressure chamber side, in a plan view, it is possible to form the second electrode having high toughness up to the vicinity of the boundary where stress concentration is likely to occur between the piezoelectric element and the vibration plate, thus, the piezoelectric element is not easily broken. Furthermore, since the third angle of the third surface is smaller than the second angle, it is possible to increase adhesion of a protective film in a case where the side surface of the piezoelectric element is covered with a protective film to the end portion of the third surface, thus, it is possible to suppress cracking in the protective film and to improve the reliability of the piezoelectric device.

The second electrode may have a third surface inclined at a third angle with respect to a surface of the vibration plate on the pressure chamber side, and the third angle is larger than the second angle and smaller than the first angle. Accordingly, since the second electrode has the third surface inclined at the third angle with respect to the surface of the vibration plate on the pressure chamber side, in a plan view, it is possible to form the second electrode having high toughness up to the vicinity of the boundary where stress concentration is likely to occur between the piezoelectric element and the vibration plate, thus, the piezoelectric element is not easily broken. Furthermore, since the third angle is larger than the second angle and smaller than the first angle, the inclination angle of the side surface of the second electrode with respect to the piezoelectric layer is increased, thus, it is possible to increase the area of the second electrode, which makes it possible to lower the resistance value of the piezoelectric element and to improve the displacement characteristics.

The pressure chamber and the piezoelectric element may be elongated in the first direction, and the second angle of the second surface may be smaller on the central portion side than in the end portion side in the first direction. Accordingly, since the pressure chamber and the piezoelectric element are elongated in the first direction, and the second angle of the second surface is smaller on the central portion side than on the end portion side in the first direction, the inclination of the second surface is gentler on the central portion side than on the end portion side in the first direction. Therefore, it is possible to precisely alleviate the stress concentration on the central portion side, where the displacement is greater than on the end portion side and the stress concentration tends to be large.

The pressure chamber and the piezoelectric element may be elongated in the first direction and the width of the second surface in the second direction which intersects the first direction is larger on the central portion side than on the end portion side in the first direction. Accordingly, since the pressure chamber and the piezoelectric element are elongated in the first direction and the width of the second surface in the second direction which intersects the first direction is larger on the central portion side than on the end portion side in the first direction, deformation occurs more easily on the central portion side than on the end portion side. Therefore, it is possible to improve the displacement characteristics on the central portion side in comparison with on the end portion side in the first direction.

The second electrode may be overlapped inside of the piezoelectric layer from peripheral portion of the front surface on the second electrode side in a plan view. Accordingly, since the second electrode overlaps inside of the piezoelectric layer from the peripheral portion of the front surface on the second electrode side in a plan view, it is possible to apply almost no voltage to the side wall portion of the piezoelectric layer. Therefore, even if the side wall portion of the piezoelectric layer is electrically deteriorated, for example, in a semiconductor manufacturing step such as ion etching, almost no voltage is applied to the side wall portion thereof, thus it is possible to increase the electrical reliability of the piezoelectric element.

The piezoelectric element and the vibration plate may have a protective film. Accordingly, since the piezoelectric element and the vibration plate have the protective film, it is possible to protect the piezoelectric element and the vibration plate from ink, moisture, or the like, thus, it is possible to suppress damage to the piezoelectric element due to ink, moisture, or the like.

The protective film may be continuous so as to cover the end portion of the second electrode and the first surface. Accordingly, even if the protective film is continuous so as to cover the end portion of the second electrode and the first surface, the inclination of the first surface makes it possible to make it difficult for cracks to appear in the protective film covering the first surface.

The protective film may be continuous so as to cover the end portion of the second electrode and the second surface via the first surface. Accordingly, even though the protective film is continuous so as to cover the end portion of the second electrode, the second surface, and the first surface, the inclination of the first surface and the second surface makes it possible to make it difficult for cracks to appear in the protective film covering the first surface and the second surface.

When the piezoelectric element is not driven, the portion forming the wall surface of the pressure chamber in the surface of the vibration plate on the pressure chamber side may be flat. Accordingly, when the piezoelectric element is not driven, since the portion forming the wall surface of the pressure chamber in the surface of the vibration plate on the pressure chamber side is flat, it is possible to make it difficult for the vibration plate to be displaced to the opposite side to the pressure chamber, thus, it is possible to make it difficult for the vibration plate to separate from the side wall of the pressure chamber.

When the piezoelectric element is not driven, a portion forming the wall surface of the pressure chamber of the surface of the vibration plate on the pressure chamber side may be bent toward the pressure chamber side of the vibration plate. Accordingly, when the piezoelectric element is not driven, since the portion forming the wall surface of the pressure chamber of the surface of the vibration plate on the pressure chamber side is bent toward the pressure chamber side of the vibration plate, it is possible to make it difficult for the vibration plate to be displaced to the opposite side of the pressure chamber compared to a case where a portion forming the wall surface of the pressure chamber is flat, thus, it is possible to make it difficult for the vibration plate to separate from the side wall of the pressure chamber.

According to still another aspect of the invention, there is provided a liquid ejecting head including any one of the piezoelectric devices of each aspect described above, in which the piezoelectric device changes a pressure of the pressure chamber to eject liquid filled in the pressure chamber from a nozzle. Accordingly, it is possible to provide a liquid ejecting head provided with a piezoelectric device which is able to alleviate the stress concentration while improving the displacement characteristics.

According to still another aspect of the invention, there is provided a liquid ejecting apparatus including any one of the piezoelectric devices of each aspect described above, in which the piezoelectric device changes a pressure of the pressure chamber to eject liquid filled in the pressure chamber from a nozzle. Accordingly, it is possible to provide a liquid ejecting apparatus provided with a piezoelectric device which is able to alleviate the stress concentration while improving the displacement characteristics.

BRIEF DESCRIPTION OF THE DRAWINGS

The invention will be described with reference to the accompanying drawings, wherein like numbers reference like elements.

FIG. 6 is a cross-sectional view of a piezoelectric device according to a first modification example of the first embodiment.

FIG. 7 is a cross-sectional view of a piezoelectric device according to a second modification example of the first embodiment.

DESCRIPTION OF EXEMPLARY EMBODIMENTS

First Embodiment

Figure 1:
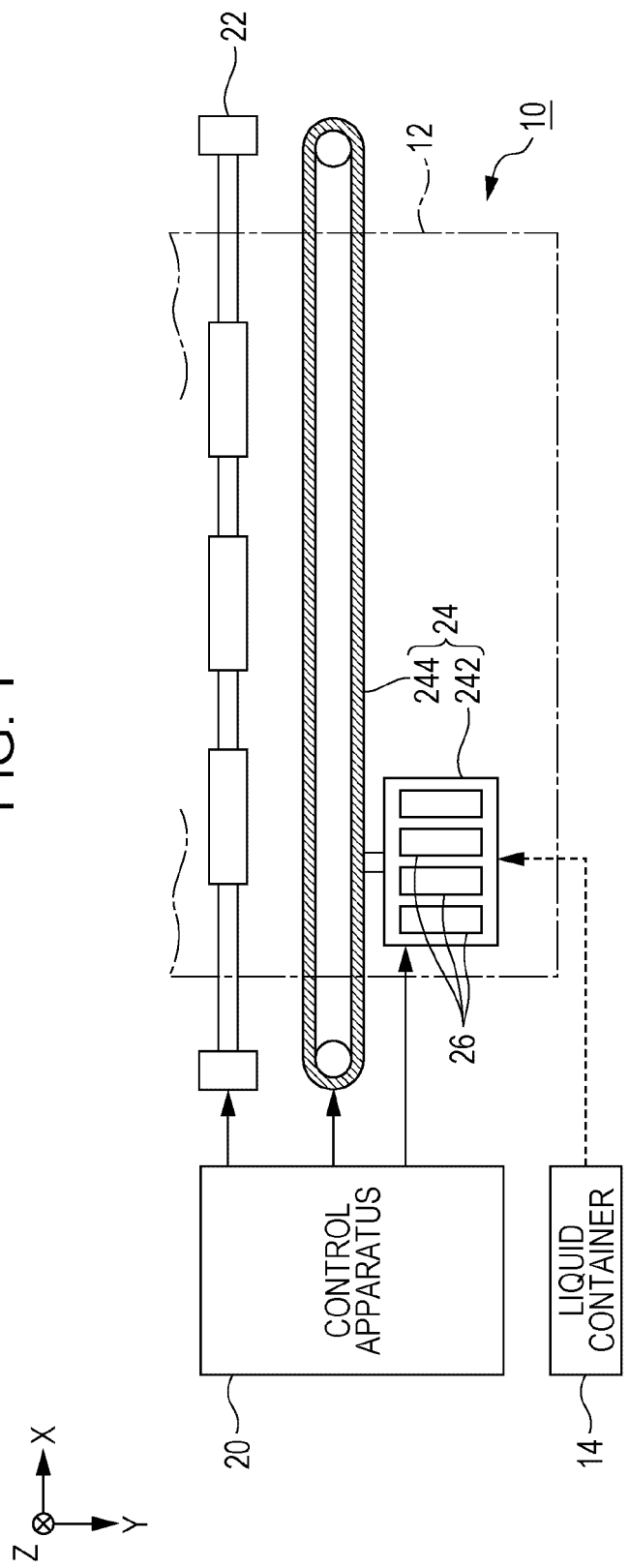
FIG. 1 is a configuration diagram of a liquid ejecting apparatus according to a first embodiment of the invention.

FIG. 1 is a configuration diagram illustrating a liquid ejecting apparatus 10 according to a first embodiment of the invention. The liquid ejecting apparatus 10 of the first embodiment is an ink jet-type printing apparatus which ejects ink, which is an example of a liquid, onto a medium 12. The medium 12 is typically a printing paper, but it is possible to use any printing target such as a resin film or cloth as the medium 12. As shown in FIG. 1, a liquid container 14 which stores ink is fixed to the liquid ejecting apparatus 10. For example, a cartridge removably attached to the liquid ejecting apparatus 10, a bag-shaped ink pack formed of a flexible film, or an ink tank capable of being refilled with ink is used as the liquid container 14. A plurality of kinds of inks having different colors are stored in the liquid container 14.

As shown in FIG. 1, the liquid ejecting apparatus 10 includes a control apparatus 20, a transport mechanism 22, a movement mechanism 24, and a plurality of liquid ejecting heads 26. The control apparatus 20 includes a processing circuit such as a central processing unit (CPU) or a FPGA (Field Programmable Gate Array) and a memory circuit such as a semiconductor memory, and carries out overall control of each element of the liquid ejecting apparatus 10. The transport mechanism 22 transports the medium 12 in the Y direction under the control of the control apparatus 20.

The movement mechanism 24 makes the plurality of liquid ejecting heads 26 reciprocate in the X direction under the control of the control apparatus 20. The X direction is a direction which intersects (typically orthogonal) the Y direction in which the medium 12 is transported. The movement mechanism 24 is provided with a carriage 242 on which a plurality of liquid ejecting heads 26 are mounted, and an endless belt 244 on which the carriage 242 is fixed. It is also possible to mount the liquid container 14 on the carriage 242 together with the liquid ejecting head 26.

Each of the plurality of liquid ejecting heads 26 ejects ink supplied from the liquid container 14 from a plurality of nozzles (ejection holes) N under the control of the control apparatus 20 to the medium 12. A desired image is formed on the front surface of the medium 12 by each of the liquid ejecting heads 26 ejecting ink onto the medium 12 in parallel with the transportation of the medium 12 by the transport mechanism 22 and the reciprocation of the carriage 242 forward and backward. Here, the X direction is an example of the first direction and the Y direction is an example of the second direction. A direction perpendicular to the X-Y plane (for example, a plane parallel to the front surface of the medium 12) is referred to below as a Z direction (an example of the third direction). The direction of the ink ejection (typically the vertical direction) by each liquid ejecting head 26 corresponds to the Z direction.

Liquid Ejecting Head

Figure 2:
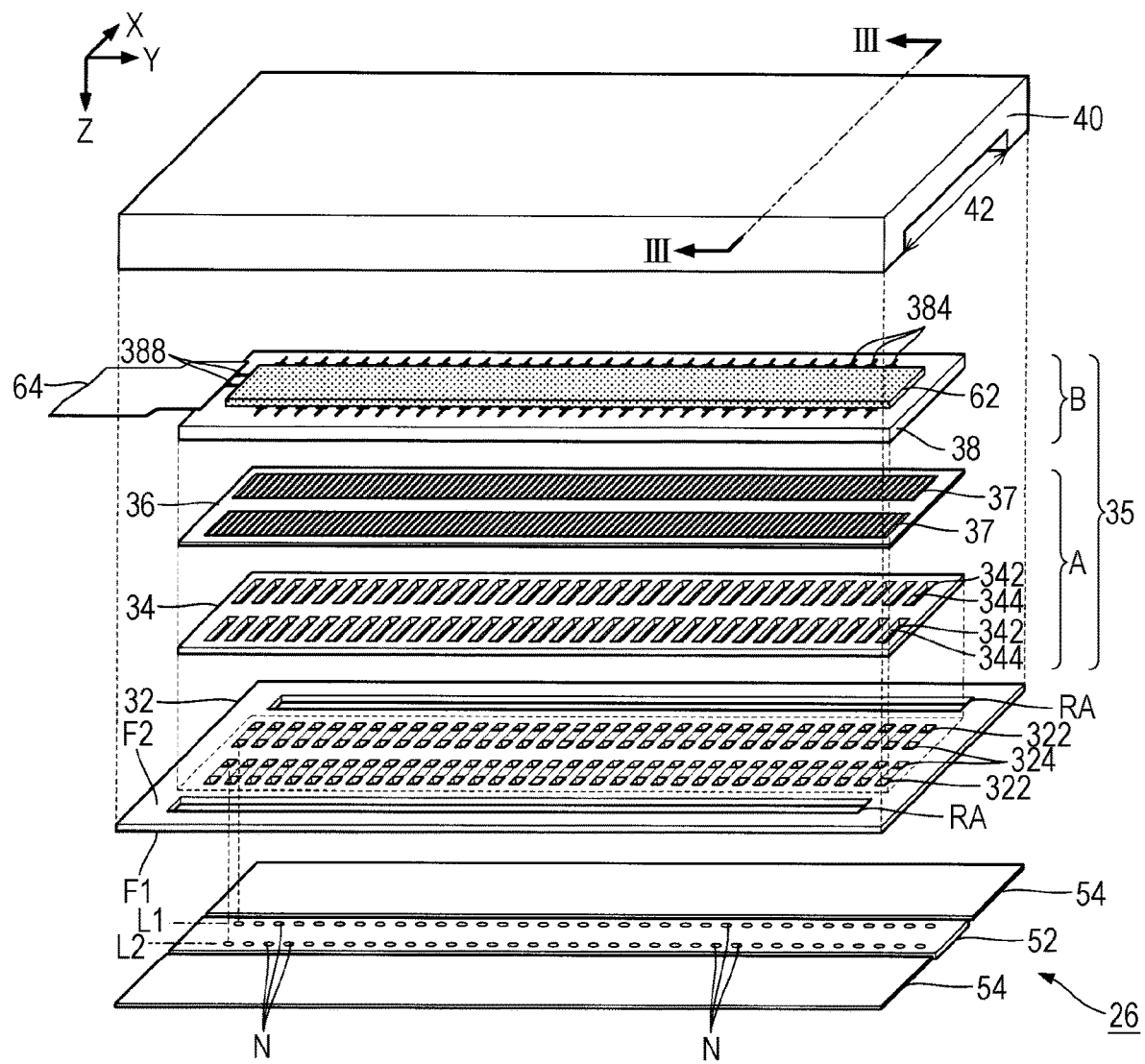
FIG. 2 is an exploded perspective view of a liquid ejecting head.
Figure 3:
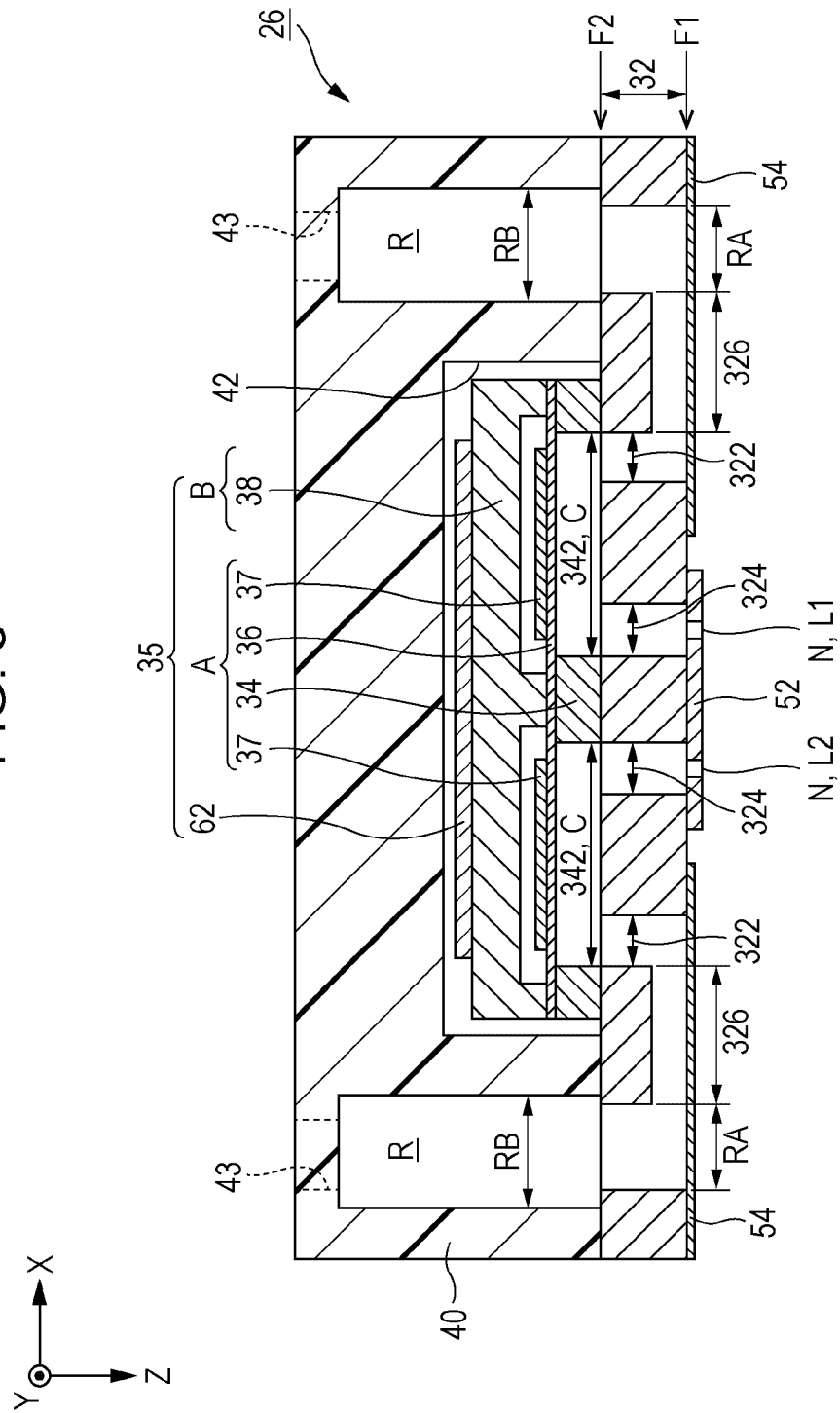
FIG. 3 is a cross-sectional view taken along a line III-III of the liquid ejecting head shown in FIG. 2.

FIG. 2 is an exploded perspective view of any one of the liquid ejecting heads 26, and FIG. 3 is a cross-sectional view taken along the line III-III in FIG. 2. As shown in FIG. 2, the liquid ejecting head 26 is provided with a plurality of nozzles N arranged in the Y direction. The plurality of nozzles N of the first embodiment are divided into a first row L1 and a second row L2. It is also possible to make the position of the nozzles N in the Y direction different between the first row L1 and the second row L2 (that is, a zigzag arrangement or a staggered arrangement), but, in the first row L1 and the second row L2, a configuration in which the positions of nozzles N in the Y direction are matched is illustrated in FIG. 3 for convenience. As shown in FIG. 2, the liquid ejecting head 26 has a structure in which the elements related to the plurality of nozzles N of the first row L1 and the elements related to the plurality of nozzles N of the second row L2 are arranged substantially line-symmetrically.

As shown in FIG. 2 and FIG. 3, the liquid ejecting head 26 is provided with a flow path substrate 32. The flow path substrate 32 is a plate-like member including a front surface F1 and a front surface F2. The front surface F1 is a surface on the positive side in the Z direction (the front surface on the medium 12 side) and the front surface F2 is a front surface on the opposite side (the negative side in the Z direction) to the front surface F1. A pressure generating unit 35 and a case member 40 are installed on the front surface F2 of the flow path substrate 32, and a nozzle plate 52 and a compliance substrate 54 are installed on the front surface F1. Schematically, each element of the liquid ejecting head 26 is a plate-like member elongated in the Y direction in the same manner as the flow path substrate 32, and the elements are bonded to each other using, for example, an adhesive. It is also possible to understand the direction in which the flow path substrate 32 and a pressure chamber substrate 34 are laminated as the Z direction.

The pressure generating unit 35 is an element for generating pressure variations for ejecting ink from the nozzles N. The pressure generating unit 35 of the present embodiment is formed by bonding the first substrate A including the pressure chamber substrate 34 and a piezoelectric device 39, the second substrate B including a wiring connection substrate (protective substrate) 38, and a driving IC 62. The piezoelectric device 39 is formed of a vibration plate 36 and a plurality of piezoelectric elements 37 and is an element for using vibration to generate pressure variations in a pressure chamber S described below which is formed in the pressure chamber substrate 34. A detailed description will be given below of the pressure generating unit 35 and the piezoelectric device 39.

The nozzle plate 52 is a plate-like member having a plurality of nozzles N formed thereon, and is installed on the front surface F1 of the flow path substrate 32 by using, for example, an adhesive. Each nozzle N is a through hole through which ink passes. The nozzle plate 52 of the first embodiment is manufactured by processing a single crystal substrate of silicon (Si) using a semiconductor manufacturing technique (for example, etching). However, it is possible to freely adopt known materials and manufacturing methods for manufacturing the nozzle plate 52.

The flow path substrate 32 is a plate-like member for forming an ink flow path. As shown in FIG. 2 and FIG. 3, in the flow path substrate 32, a space RA, a plurality of supply flow paths 322, and a plurality of communication flow paths 324 are formed for each of the first row L1 and the second row L2. The space RA is an elongated opening along the Y direction in a plan view (that is, viewed from the Z direction), and the supply flow paths 322 and the communication flow paths 324 are through holes formed for each nozzle N. A plurality of the supply flow paths 322 are arranged in the Y direction, and a plurality of the communication flow paths 324 are also arranged in the Y direction in the same manner. In addition, as shown in FIG. 3, an intermediate flow path 326 extending over a plurality of the supply flow paths 322 is formed on the front surface F1 of the flow path substrate 32. The intermediate flow path 326 is a flow path connecting the space RA and the plurality of supply flow paths 322. On the other hand, the communication flow paths 324 communicate with the nozzles N.

The wiring connection substrate 38 in FIG. 2 and FIG. 3 is a plate-like member for protecting the plurality of piezoelectric elements 37, and is installed on the front surface of the vibration plate 36 (the front surface on the opposite side to the pressure chamber C). In the same manner as the flow path substrate 32 and the pressure chamber substrate 34, the material and method for manufacturing the wiring connection substrate 38 may be freely chosen, but, for example, it is possible to form the wiring connection substrate 38 by processing a single crystal substrate of, for example, silicon (Si) by a semiconductor manufacturing technique. As shown in FIG. 2 and FIG. 3, the driving IC 62 is installed on the front surface (referred to below as the "mounting surface") of the wiring connection substrate 38 on the opposite side to the front surface (referred to below as "bonding surface") on the vibration plate 36 side. The driving IC 62 is a substantially rectangular IC chip on which a driving circuit for driving each piezoelectric element 37 by generating and supplying a driving signal under the control of the control apparatus 20 is mounted. In the mounting surface of the wiring connection substrate 38, wiring 384 connected to the output terminal of the driving signal (driving voltage) of the driving IC 62 is formed for each piezoelectric element 37. In addition, in the mounting surface of the wiring connection substrate 38, wiring 385 connected to the output terminal of the base voltage (the base voltage of the driving signal of the piezoelectric element 37) of the driving IC 62 is formed to be continuous in the Y direction along the arrangement of the piezoelectric element 37.

The case member 40 shown in FIG. 2 and FIG. 3 is a case for storing ink to be supplied to a plurality of pressure chambers C (and a plurality of nozzles N). The front surface of the case member 40 on the positive side in the Z direction is fixed to the front surface F2 of the flow path substrate 32 with, for example, an adhesive. As shown in FIG. 2 and FIG. 3, a groove-shaped concave portion 42 extending in the Y direction is formed on the front surface of the case member 40 on the positive side in the Z direction. The wiring connection substrate 38 and the driving IC 62 are accommodated inside the concave portion 42. The case member 40 is formed of a material different from the flow path substrate 32 and the pressure chamber substrate 34. For example, it is possible to manufacture the case member 40 by injection molding of a resin material. However, it is possible to freely adopt known materials and manufacturing methods for manufacturing the case member 40. Preferable examples of the material of the case member 40 include synthetic fibers and resin materials.

As shown in FIG. 3, in the case member 40, a space RB is formed for each of the first row L1 and the second row L2. The space RB of the case member 40 and the space RA of the flow path substrate 32 communicate with each other. The space formed by the space RA and the space RB functions as a liquid storage chamber (reservoir) R which stores the ink supplied to the plurality of pressure chambers C. The liquid storage chamber R is a common liquid chamber for a plurality of nozzles N. An inlet port 43 for introducing the ink supplied from the liquid container 14 into the liquid storage chamber R is formed in each of the first row L1 and the second row L2 on the front surface of the case member 40 on the opposite side to the flow path substrate 32.

The ink supplied from the liquid container 14 to the inlet port 43 is stored in the space RB and the space RA in the liquid storage chamber R. The ink stored in the liquid storage chamber R branches from the intermediate flow path 326 into a plurality of supply flow paths 322 and is supplied and filled in each pressure chamber C in parallel.

As shown in FIG. 2, the compliance substrate 54 is installed on the front surface F1. The compliance substrate 54 is a flexible film which absorbs pressure variations in the ink in the liquid storage chamber R. As shown in FIG. 3, the compliance substrate 54 is installed on the front surface F1 of the flow path substrate 32 so as to close the space RA of the flow path substrate 32, the intermediate flow path 326, and the plurality of supply flow paths 322, and forms the wall surface (specifically, the bottom surface) of the liquid storage chamber R.

The pressure generating unit 35 shown in FIG. 3 is formed by laminating a first substrate A, a second substrate B, and the driving IC 62. The first substrate A is a substrate including the pressure chamber substrate 34, the vibration plate 36, and the plurality of piezoelectric elements 37, and the second substrate B is a substrate including the wiring connection substrate 38.

The pressure chamber substrate 34 is a plate-like member in which a plurality of openings 342 forming the pressure chambers C are formed in each of the first row L1 and the second row L2 and is installed on the front surface F2 of the flow path substrate 32, for example, using an adhesive. The plurality of openings 342 are arranged in the Y direction. Each opening 342 is an elongated through hole which is formed for each nozzle N and extends along the X direction in a plan view. In the same manner as the nozzle plate 52 described above, the flow path substrate 32 and the pressure chamber substrate 34 are manufactured by processing a substrate, for example, a single crystal substrate (silicon substrate) of silicon (Si) using a semiconductor manufacturing technique. However, it is possible to freely adopt known materials and manufacturing methods for manufacturing the flow path substrate 32 and the pressure chamber substrate 34. The piezoelectric device 39 is installed on the front surface of the pressure chamber substrate 34 opposite to the flow path substrate 32.

Piezoelectric Device

Figure 4:
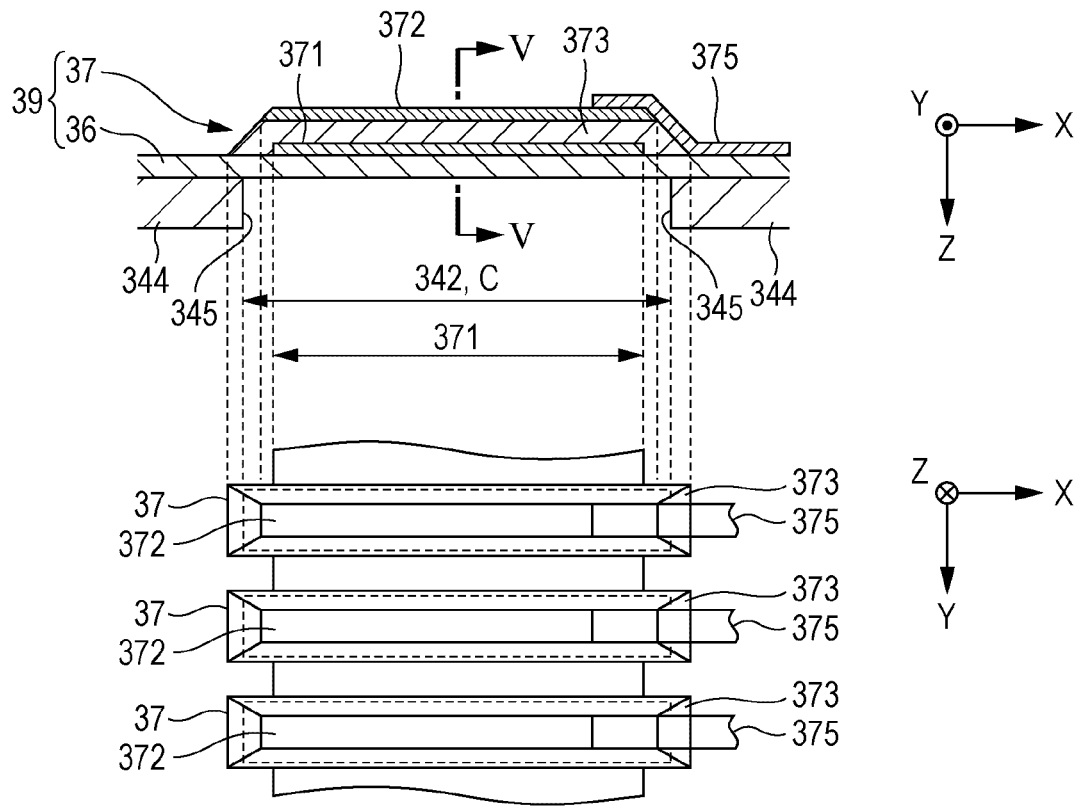
FIG. 4 is a cross-sectional view and a plan view of a piezoelectric device.
Figure 5:
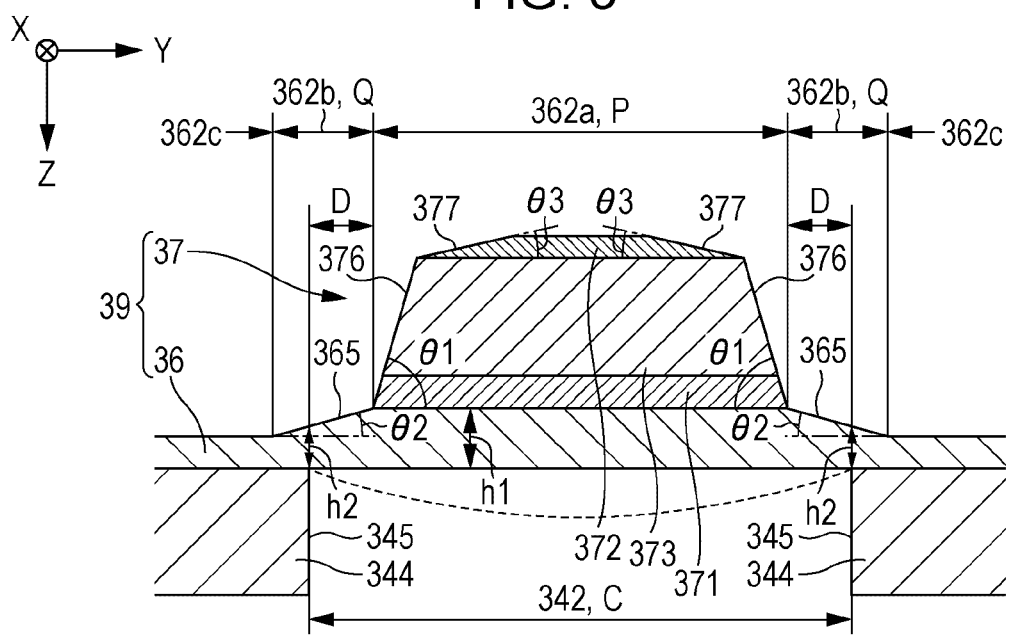
FIG. 5 is a cross-sectional view taken along a line V-V of the piezoelectric device shown in FIG. 4.

FIG. 4 is an enlarged cross-sectional view and plan view of the piezoelectric device 39. FIG. 4 is a cross-sectional view (diagram on the upper side of FIG. 4) which cuts away the piezoelectric device 39 along the X-Z plane, and the plan view of FIG. 4 (diagram on the lower side of FIG. 4) shows the piezoelectric device 39 from the Z direction. FIG. 5 is a cross-sectional view taken along the line V-V of the piezoelectric device 39 shown in FIG. 4. As shown in FIG. 4 and FIG. 5, the piezoelectric device 39 is formed of the vibration plate 36 and a plurality of piezoelectric elements 37 and the piezoelectric element 37 vibrates the vibration plate 36 to generate pressure variations in each pressure chamber C. As shown in FIG. 4, the pressure chamber C and the piezoelectric element 37 are rectangular shapes each having an elongated long side extending in the X direction in a plan view and a short side extending in the Y direction and shorter than the long side. Here, the term "elongated" means elongated in the X direction in a case where the sides in the X direction of the pressure chambers C and the piezoelectric elements 37 are longer than the sides in the Y direction in the plan view seen from the surface FA on the pressure chamber C side of the vibration plate 36.

The vibration plate 36 is a plate-like member (vibration plate) which is able to elastically vibrate. The vibration plate 36 is laminated and bonded to a side wall 344 of the pressure chamber C and forms a wall surface (specifically, the upper surface) of the pressure chamber C. Here, in the present embodiment, a case is exemplified in which the pressure chamber substrate 34 and the vibration plate 36 are separately formed, but the pressure chamber substrate 34 and the vibration plate 36 may be integrally formed. It is possible to integrally form the pressure chamber substrate 34 and the vibration plate 36, for example, by selectively removing a part of the plate-like member having a predetermined thickness in the thickness direction with respect to a region corresponding to the opening 342.

As shown in FIG. 5, in the present embodiment, when the piezoelectric element 37 is not driven, the portion forming the wall surface of the pressure chamber C in the surface FA of the vibration plate 36 on the pressure chamber C side is flat. According to such a configuration, since it is possible to make it difficult for the vibration plate 36 to be displaced to the opposite side to the pressure chamber C, it is possible to make it difficult for the vibration plate 36 to be separated from the side wall 344 of the pressure chamber C. Here, as shown by the dotted line in FIG. 5, when the piezoelectric element 37 is not driven, the portion forming the wall surface of the pressure chamber C in the surface of the vibration plate 36 on the side of the pressure chamber C may be bent toward the pressure chamber side of the vibration plate. According to such a configuration, since it is possible to make it more difficult for the vibration plate 36 to be displaced to the opposite side to the pressure chamber C than in a case where the portion forming the wall surface of the pressure chamber C is flat, it is possible to make the vibration plate 36 difficult to separate from the side wall 344 of the pressure chamber C. Here, when the piezoelectric element 37 is not driven, in a case where the portion forming the wall surface of the pressure chamber C in the surface of the vibration plate 36 on the pressure chamber C side is bent toward the pressure chamber C side of the vibration plate 36, the flat surface virtually laminated on the upper side of one side wall 344 and the other side wall 344 of the pressure chamber C is defined as "the surface FA on the pressure chamber C side of the vibration plate 36", and the surface FA is set as a reference surface at angles $\theta 1$, $\theta 2$, $\theta 3$, $\theta 1'$, $\theta 2'$, $\theta 3'$, $\theta 21$, and $\theta 22$ described below.

As shown in FIG. 2 and FIG. 3, the front surface F2 of the flow path substrate 32 and the vibration plate 36 are opposed to each other with an interval therebetween inside each opening 342. The space positioned between the front surface F2 of the flow path substrate 32 and the vibration plate 36 inside the opening 342 functions as a pressure chamber C for applying pressure to the ink filled in the space. The pressure chambers C are formed individually for each nozzle N. As shown in FIG. 2, for each of the first row L1 and the second row L2, a plurality of pressure chambers C (openings 342) are arranged in the Y direction. Any one of the pressure chambers C communicates with the space RA via the supply flow paths 322 and the intermediate flow path 326 and communicates with the nozzles N via the communication flow paths 324. It is also possible to add a predetermined flow path resistance by forming a throttle flow path narrowing the flow path width in the opening 342.

As shown in FIG. 2 to FIG. 5, on the front surface of the vibration plate 36 on the opposite side to the pressure chamber C, a plurality of piezoelectric elements 37 corresponding to different nozzles N are installed in each of the first row L1 and the second row L2. The piezoelectric element 37 is a pressure generating element which generates pressure in the pressure chamber C by being deformed according to the supply of a driving signal. The plurality of piezoelectric elements 37 are arranged in the Y direction so as to correspond to each of the pressure chambers C.

As shown in the cross-sectional views of FIG. 4 and FIG. 5, the piezoelectric element 37 is a laminate in which a piezoelectric layer 373 is interposed between a first electrode 371 and second electrode 372 opposed to each other. The first electrode 371 is formed on the front surface of the vibration plate 36 so as to be continuous over the plurality of piezoelectric elements 37 and is a common electrode for the plurality of piezoelectric elements 37. The material of the first electrode 371 is preferably a material which does not oxidize and which is capable of maintaining conductivity when film-forming the piezoelectric layer 373 and, for example, a noble metal such as platinum (Pt) or iridium (Ir) or a conductive oxide represented by lanthanum nickel oxide (LNO) or the like is preferably used. Here, an adhesion layer may be provided between the first electrode 371 and the vibration plate 36 to secure the adhesion force. That is, the first electrode 371 is not necessarily provided directly on the front surface of the vibration plate 36, but may be provided on the front surface of the vibration plate 36 via an adhesion layer. As the adhesion layer, it is possible to use zirconium, titanium, titanium oxide, or the like.

On the front surface of the first electrode 371 (the front surface on the opposite side to the vibration plate 36), the piezoelectric layer 373 and the second electrode 372 are formed individually for each piezoelectric element 37 (for each nozzle N). As shown in the plan view of FIG. 4, each second electrode 372 is laminated on the opposite side to the vibration plate 36 with respect to the first electrode 371, and each piezoelectric layer 373 is laminated so as to be interposed between the first electrode 371 and the second electrodes 372. Each second electrode 372 is an electrode extending along the Y direction. The piezoelectric layer 373 is formed by patterning for each pressure chamber C. The width of the piezoelectric layer 373 in the X direction is wider than the width of the pressure chamber C (opening 342) in the X direction. Therefore, the piezoelectric layer 373 extends to the outside of the pressure chamber C in the X direction of the pressure chamber C. Therefore, the first electrode 371 is covered with the piezoelectric layer 373 in the X direction of the pressure chamber C.

The piezoelectric layer 373 is, for example, a ferroelectric ceramic material exhibiting an electromechanical conversion action, such as a perovskite-structure crystal film (perovskite crystal). Here, the material of the piezoelectric layer 373 is not limited to the material described above and, for example, in addition to ferroelectric piezoelectric materials such as lead zirconate titanate (PZT) and materials where a metal oxide such as niobium oxide, nickel oxide or magnesium oxide is added to such ferroelectric piezoelectric materials, it is possible to use a lead-free piezoelectric material which does not include lead without being limited to lead-based piezoelectric materials including lead.

The second electrodes 372 are provided on the surface of the piezoelectric layer 373 opposite to the first electrode 371 and form individual electrodes corresponding to the plurality of piezoelectric elements 37. Here, the second electrodes 372 may be provided directly on the piezoelectric layer 373 or another member may be interposed between the piezoelectric layer 373 and the second electrodes 372. As the second electrodes 372, a material which is able to suitably form an interface with the piezoelectric layer 373 and which is able to exhibit insulation properties and piezoelectric characteristics is desirable, and examples thereof include noble metal materials such as iridium (Ir), platinum (Pt), palladium (Pd), and gold (Au), and a conductive oxide represented by lanthanum nickel oxide (LNO) are suitably used. In addition, the second electrodes 372 may be formed by laminating a plurality of materials.

As shown in FIG. 4, the second electrodes 372 of the piezoelectric element 37 are connected to the driving IC 62 via a lead electrode 375 on a part of the piezoelectric layer 373 which is drawn out to the outside. In addition, the first electrode 371 of the piezoelectric element 37 is also connected to the driving IC 62 via a lead electrode (not shown). Here, in the piezoelectric element 37 of the present embodiment, a case is exemplified in which the first electrode 371 is used as the common electrode for the plurality of piezoelectric elements 37, and the second electrodes 372 are formed as individual electrodes corresponding to the plurality of piezoelectric elements 37; however, the invention is not limited to this configuration, the second electrode 372 may be a common electrode of the plurality of piezoelectric elements 37, and the first electrode 371 may be an individual electrode corresponding to the plurality of piezoelectric elements 37.

According to the piezoelectric element 37 having such a configuration, applying a voltage between the first electrode 371 and the second electrodes 372 generates piezoelectric strain in the piezoelectric layer 373 interposed between the first electrode 371 and the second electrodes 372 to create displacement. The vibration plate 36 vibrates in conjunction with the piezoelectric strain of the piezoelectric layer 373, to vary the pressure in the pressure chamber C.

As shown in FIG. 5, the vibration plate 36 of the first embodiment has an active portion 362a overlapping the piezoelectric element 37 in a plan view (as viewed from the Z direction), and a fixing portion 362c overlapping the side wall 344 of the pressure chamber C in a plan view. Taper portions 362b are provided between the active portion 362a and the fixing portions 362c. The thicknesses of the fixing portions 362c and of the active portion 362a are substantially equal, and the thickness of the fixing portions 362c is thinner than the thickness of the active portion 362a. The taper portions 362b are portions where the thickness decreases from the active portion 362a toward the fixing portions 362c. The taper portions 362b are on the negative side and the positive side in the Y direction with the active portion 362a interposed therebetween.

The active portion 362a is a portion which vibrates in conjunction with the piezoelectric strain of the piezoelectric layer 373. When the active portion 362a of the first embodiment is a first portion P and the portion of the taper portion 362b overlapping an inner peripheral surface 345 of the side wall 344 of the pressure chamber C in a plan view is a second portion Q, the portion between the first portion P and the second portion Q is an arm portion D supporting the first portion P (the active portion 362a). Since the thickness h2 of the second portion Q is thinner than a thickness h1 of the first portion P, the arm portion D is thin and the first portion P (the active portion 362a) is easily displaced, thus, it is possible to improve the displacement characteristics.

A side surface 376 (a side surface of the first electrode 371 and the piezoelectric layer 373) which intersects the vibration plate 36 in the piezoelectric element 37 inclines at a first angle θ1 with respect to a surface FA (a surface of the fixing portion 362c on the positive side in the Z direction, reference surface) of the vibration plate 36 on the pressure chamber C side. The side surface 376 of the piezoelectric element 37 referred to here is the side surface of the long side of the piezoelectric element 37 along the longitudinal direction (X direction), and is the side surface on the positive side and the negative side of the piezoelectric element 37 in the Y direction in FIG. 5. On the other hand, a front surface 365 of the taper portion 362b of the vibration plate 36 on the opposite side to the pressure chamber C is inclined at a second angle θ2 with respect to the surface FA (reference surface) of the vibration plate 36 on the pressure chamber C side. The taper portion 362b is inclined from the active portion 362a toward the side wall 344 of the pressure chamber C such that the thickness thereof is thinner.

The second angle θ2 of the piezoelectric element 37 is smaller than the first angle θ1 of the taper portion 362b of the vibration plate 36. That is, in the first embodiment, when the side surface 376 of the piezoelectric element 37 is the first surface and the front surface 365 of the taper portion 362b is the second surface, the inclination angle of the second surface (the second angle θ2) is smaller than the inclination angle (first angle θ1) of the first surface. The first surface and the second surface may be flat inclined surfaces or inclined surfaces including curves. Since the first surface of the piezoelectric element 37 and the second surface of the vibration plate 36 make it possible to make the changes in the thickness of the piezoelectric device 39 gentle from the side surface 376 of the piezoelectric element 37 to the vicinity of the boundary where stress concentration is likely to occur between the piezoelectric element 37 and the vibration plate 36, it is possible to alleviate the stress concentration.

As described above, according to the present embodiment, it is possible to alleviate the stress concentration while improving the displacement characteristics. Therefore, it is possible to suppress damage to the piezoelectric device 39 due to the stress concentration while improving the displacement characteristics. Moreover, in the first embodiment, since the end portion (the boundary between the taper portion 362b and the fixing portion 362c) of the pressure chamber C on the side wall 344 side of the second surface (the front surface 365 of the taper portion 362b) of the vibration plate 36 overlaps the side wall 344 of the pressure chamber C in a plan view, the end portion of the second surface of the vibration plate 36 is not displaced. Therefore, even if displacement occurs, it is possible to alleviate the stress concentration even at the end portion of the second surface of the vibration plate 36 where the stress tends to concentrate. Here, in the present embodiment, a case is exemplified in which there is a second surface straddling the space (the arm portion D) between the first portion P and the second portion Q of the vibration plate 36, but without being limited thereto, there may be a second surface which does not straddle between the first portion P and the second portion Q of the vibration plate 36. Specifically, for example, there may be a configuration in which, between the first portion P and the second portion Q of the vibration plate 36, the inclined second surface is on the side of the first portion P and the non-inclined flat surface is on the second portion Q side. In addition, a case is exemplified in which the first surface of the present embodiment straddles the piezoelectric layer 373 and the first electrode 371, but the first surface may be only on the piezoelectric layer 373, and the first surface may be only on the first electrode 371.

In addition, a side surface 377 of the second electrode 372 of the first embodiment is inclined at the third angle θ3 with respect to the surface FA (reference surface) of the vibration plate 36 on the pressure chamber C side. Therefore, in the plan view, since it is possible to form the second electrodes 372 having high toughness up to the vicinity of the boundary where stress concentration is likely to occur between the piezoelectric element 37 and the vibration plate 36, the piezoelectric element 37 is not easily broken. Moreover, when the side surface 377 of the second electrode 372 is the third surface, the inclination angle (third angle θ3) of the third surface is smaller than the inclination angle (the second angle θ2) of the second surface (the front surface 365 of the taper portion 362b) of the vibration plate 36. Accordingly, in a case where the side surface 376 of the piezoelectric element 37 is covered with a protective film 392 to the end portion of the third surface of the second electrode 372 as in the first modification example of the first embodiment shown in FIG. 6, it is easier to form the protective film 392 than in a case where the end portion of the second electrode 372 is close to a right angle and it is possible to increase the adhesiveness of the protective film 392, thus, it is possible to suppress cracking in the protective film 392 and to improve the reliability of the piezoelectric device 39. The protective film 392 in FIG. 6 is continuous so as to cover the end portion of the third surface of the second electrode 372 and the fixing portion 362c of the vibration plate 36 via the first surface of the piezoelectric element 37 and the second surface of the vibration plate 36. Covering the piezoelectric element 37 and the vibration plate 36 with the protective film 392 in this manner makes it possible to protect the piezoelectric element 37 and the vibration plate 36 from ink, moisture, and the like, thus, it is possible to suppress damage to the piezoelectric element 37 caused by ink, moisture, or the like. In addition, as shown in FIG. 6, even when the protective film 392 is continuous from the end portion of the third surface of the second electrode 372 so as to cover the first surface and the second surface, the gentle inclination of the first surface and the second surface makes it possible to make it difficult for cracks to appear in the protective film.

Here, the third angle θ3 of the third surface of the second electrode 372 may be larger than the second angle θ2 of the second surface of the vibration plate 36 and smaller than the first angle θ1 of the first surface of the piezoelectric element 37. According to this, since the inclination angle of the side surface 377 of the second electrode 372 with respect to the piezoelectric layer 373 is increased, it is possible to increase the area of the second electrode 372 in the non-inclined portion, thus it is possible to lower the resistance value of the piezoelectric element 37 and to improve the displacement characteristics.

In addition, in the configuration of FIG. 5, a case is exemplified in which the side surface 376 on the negative side and the positive side of the piezoelectric element 37 in the Y direction are each formed as a single inclined surface, but the invention is not limited thereto, and the side surface 376 of the piezoelectric element 37 may be formed of a plurality of inclined surfaces having different inclination angles. For example, in the second modification example of the first embodiment shown in FIG. 7, a case is exemplified in which the side surfaces 376 on the negative side and positive side in the Y direction are each formed by two inclined surfaces 376a and 376b from the active portion 362a toward the side wall 344 of the pressure chamber C. The inclined surface 376a may be inclined at the first angle θ1 described above with respect to the surface FA (reference surface) on the pressure chamber C side of the vibration plate 36, and the inclined surface 376b may be inclined at the second angle θ2 described above with respect to the surface FA (reference surface) on the pressure chamber C side of the vibration plate 36. In such a case, it is possible for the inclined surface 376a to be the first surface and the inclined surface 376b to be the second surface. Since forming the side surfaces 376 of the piezoelectric element 37 with a plurality of inclined surfaces having different inclination angles in this manner makes it possible to make the changes in the thickness of the piezoelectric device 39 gentle in the vicinity of the boundary where the stress concentration is likely to occur between the piezoelectric element 37 and the vibration plate 36, it is possible to alleviate the stress concentration.

Here, a description will be given of a method for manufacturing the piezoelectric device 39 of the first embodiment. The piezoelectric device 39 is formed by film formation or dry etching performed on a silicon wafer. The method for manufacturing the piezoelectric device 39 includes a step of film-forming the vibration plate 36, the first electrode 371, the piezoelectric layer 373, and the second electrodes 372 on the pressure chamber substrate 34, a step of forming each piezoelectric element 37 by patterning and dry etching, and a step of forming the opening 342 forming the pressure chamber C in the pressure chamber substrate 34.

In the film forming step, the vibration plate 36 (for example, $ZrO_2/SiO_2$) and the first electrode 371 are formed on the pressure chamber substrate 34 and patterned such that the first electrode 371 forms a common electrode, then the piezoelectric layer 373 and the second electrodes 372 are formed. It is possible to carry out the film formation by a physical vapor deposition (PVD, vapor deposition film) method such as a sputtering method or a laser ablation method, a liquid phase method such as a sol-gel method, a metal-organic decomposition (MOD) method, and a plating method.

In the step of forming each piezoelectric element 37, it is possible to form a resist on the piezoelectric layer 373 and pattern the second electrodes 372 and the piezoelectric layer 373 by, for example, dry etching. The dry etching is preferably performed using an etching apparatus using high-density plasma such as inductively coupled plasma (ICP) at a pressure of 1.0 Pa or less. As the etching gas, for example, it is possible to use a mixed gas of a chlorine-based gas and a Freon-based gas. Examples of the chlorine-based gas include BCl3, Cl2, and the like. Examples of Freon-based gases include CF4, C2F6, and the like.

In the piezoelectric layer 373, due to the μ loading effect of dry etching, the taper portion 362b is formed with a film thickness which becomes thinner in a direction away from the resist pattern. The μ loading effect is a phenomenon in which the etching rate and shape change due to local differences in pattern density. In the present embodiment, the supply of the etching gas is insufficient in the vicinity of the resist pattern, lowering the etching rate, and, as the distance from the resist pattern increases, the etching gas is more easily supplied, raising the etching rate. When the dry etching is further continued in this state, the front surface 365 (second surface) of the taper portion 362b of the vibration plate 36 having an inclination angle (second angle θ2) smaller than the inclination angle (first angle θ1) of the side surface 376 (first surface) of the piezoelectric element 37 is formed. In this manner, in the present embodiment, using the μ loading effect of dry etching makes it possible to easily form the first surface and the second surface having different inclination angles.

Here, in a case where the protective film 392 in FIG. 6 is formed, the protective film 392 is first formed over the entire surface of the piezoelectric element 37 and the vibration plate 36, and then an opening 392a is formed in the second electrode 372. As the protective film 392, it is preferable to use a film forming material having an excellent moisture protection performance such as aluminum oxide (alumina) or diamond-like carbon (DLC). In the configuration of FIG. 6, the side surface 376 (first surface) of the piezoelectric element 37 and the front surface 365 (second surface) of the taper portion 362b of the vibration plate 36 are inclined, and furthermore, the side surface 377 (third surface) of the second electrode 372 is also inclined, thus, the adhesion of the protective film 392 is good. Therefore, it is possible to suppress cracking in the protective film 392 and to manufacture the piezoelectric device 39 with higher reliability.

Second Embodiment

Figure 8:
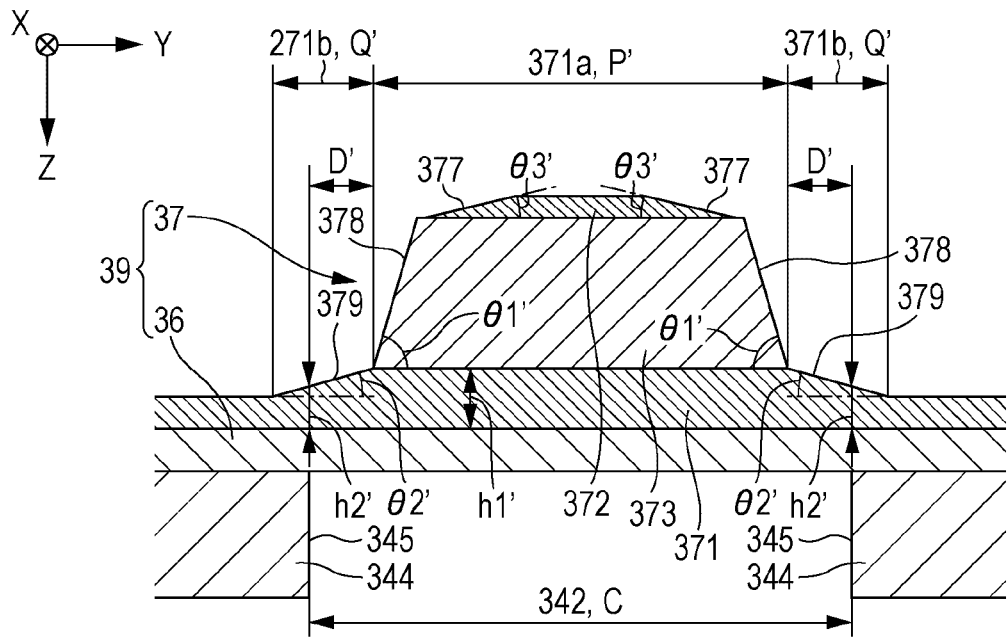
FIG. 8 is a cross-sectional view of a piezoelectric device according to a second embodiment.

A description will be given of the second embodiment of the invention. For the elements having the same operations and functions as the elements in the first embodiment in each of the following examples, the reference numerals used in the description of the first embodiment are used, and the detailed description thereof is appropriately omitted. FIG. 8 is a cross-sectional view of the piezoelectric device 39 according to the second embodiment and corresponds to FIG. 5. FIG. 5 exemplifies a case where the taper portion 362b is formed in the vibration plate 36 such that the side surface 376 of the piezoelectric element 37 and the front surface 365 of the taper portion 362b are inclined surfaces, thus, the inclination of the side surface of the piezoelectric device 39 is gentle. FIG. 8 exemplifies a case where, in the piezoelectric device 39, the thickness of the vibration plate 36 is substantially uniform, a taper portion 371b is formed in the first electrode 371, and a side surface 378 of the piezoelectric layer 373 and a front surface 369 of the taper portion 371b are formed to be inclined surfaces, thus, the inclination of the side surface of the piezoelectric device 39 is gentle.

Specifically, as shown in FIG. 8, the first electrode 371 of the second embodiment is provided with an active portion 371a overlapping the piezoelectric layer 373 in a plan view (viewed from the Z direction), and the taper portion 371b on the side wall 344 side of the pressure chamber C from the active portion 371a. The taper portions 371b are on the negative side and the positive side in the Y direction with the active portion 371a interposed therebetween. The thickness of the active portion 371a is substantially uniform and the thickness of the taper portion 371b is thin from the active portion 371a toward the side wall 344 of the pressure chamber C. When the active portion 371a of the second embodiment is the first portion P' and the portion of the taper portion 371b overlapping the inner peripheral surface 345 of the side wall 344 of the pressure chamber C in a plan view is the second portion Q', the portion between the first portion P' and the second portion Q' is the arm portion D' which supports the first portion P' (the active portion 371a). Since the thickness h2' of the second portion Q' is thinner than a thickness h1' of the first portion P', the arm portion D' is thin and the first portion P' (the active portion 371a) is easily displaced, thus it is possible to improve the displacement characteristics.

The side surface 378 of the piezoelectric layer 373 which intersects the first electrode 371 is inclined at a first angle θ1' with respect to the surface FA (reference surface) on the pressure chamber C side of the vibration plate 36. The side surface 378 of the piezoelectric layer 373 here is a side surface of the long side of the piezoelectric layer 373 in the longitudinal direction (X direction), and is the side surface on the positive side and the negative side of the piezoelectric layer 373 in the Y direction in FIG. 8. On the other hand, the front surface 369 of the taper portion 371b of the first electrode 371 on the opposite side to the pressure chamber C is inclined at the second angle θ2' with respect to the surface FA (reference surface) on the pressure chamber C side of the vibration plate 36. The taper portion 371b is inclined from the active portion 371a toward the side wall 344 of the pressure chamber C such that the thickness thereof is thinner.

The second angle θ2' of the piezoelectric layer 373 is smaller than the first angle θ1' of the taper portion 371b of the first electrode 371. In other words, in the second embodiment, when the side surface 378 of the piezoelectric layer 373 is the first surface and the front surface 369 of the taper portion 371b is the second surface, the inclination angle (the second angle θ2') of the second surface is smaller than the inclination angle (first angle θ1') of the first surface. Here, the first surface and the second surface may be flat inclined surfaces or inclined surfaces including curves. Since the first surface of the piezoelectric layer 373 and the second surface of the first electrode 371 makes it possible to make the changes in the thickness of the piezoelectric device 39 gentle from the side surface 378 of the piezoelectric layer 373 in the vicinity of the boundary where the stress concentration is likely to occur between the piezoelectric element 37 and the vibration plate 36, it is possible to alleviate the stress concentration.

Thus, according to the second embodiment, in the same manner as the first embodiment, it is also possible to alleviate the stress concentration while improving the displacement characteristics. Therefore, it is possible to suppress damage (burning) of the piezoelectric device 39 due to stress concentration while improving the displacement characteristics. Moreover, in the second embodiment, since the end portion of the second surface (a front surface 379 of the taper portion 371b) of the first electrode 371 on the side wall 344 side of the pressure chamber C overlaps the side wall 344 of the pressure chamber C in a plan view, the end portion of the second surface of the first electrode 371 is not displaced. Therefore, even if displacement occurs, it is possible to also alleviate the stress concentration even at the end portion of the second surface of the first electrode 371 where stress tends to concentrate. Here, in the present embodiment, a case is exemplified in which the second surface is provided across the space (the arm portion D') between the first portion P' and the second portion Q' of the first electrode 371; however, without being limited thereto, the second surface may be provided without straddling between the first portion P' and the second portion Q' of the first electrode 371. Specifically, for example, between the first portion P' and the second portion Q' of the first electrode 371 may be configured such that the inclined second surface is on the side of the first portion P', and the non-inclined flat surface is on the side of the second portion Q'.

Figure 9:
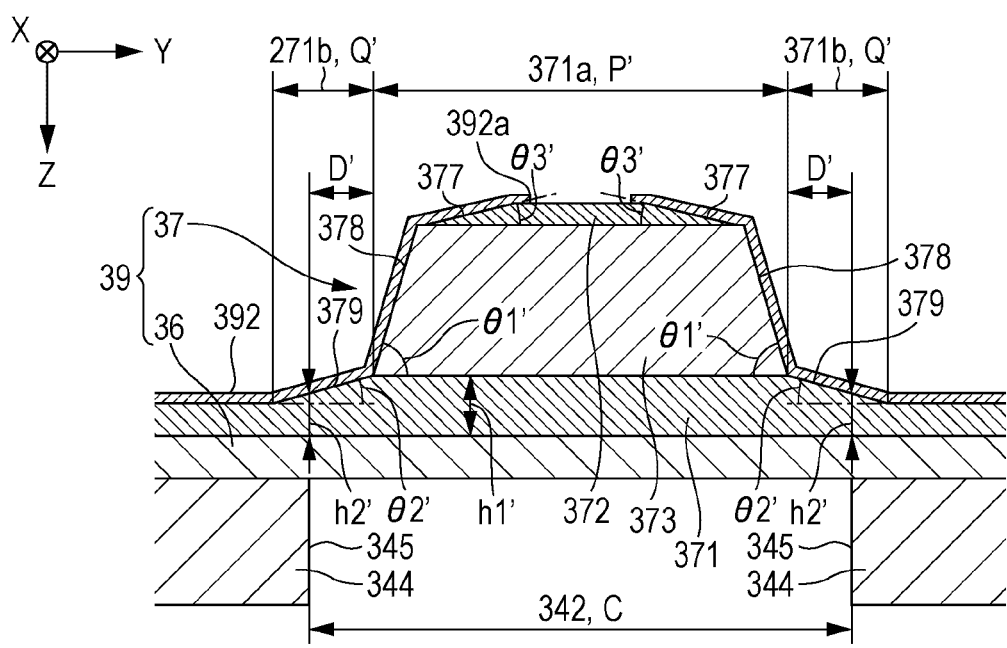
FIG. 9 is a cross-sectional view of a piezoelectric device according to a first modification example of the second embodiment.

In addition, the side surface 377 of the second electrode 372 of the second embodiment is inclined at the third angle θ3' with respect to the surface FA (reference surface) of the vibration plate 36 on the pressure chamber C side. Therefore, in a plan view, since it is possible to form the second electrodes 372 having high toughness up to the vicinity of the boundary where stress concentration is likely to occur between the piezoelectric element 37 and the vibration plate 36, the piezoelectric element 37 is not easily broken. Moreover, when the side surface 377 of the second electrode 372 is the third surface, the inclination angle (third angle θ3') of the third surface is smaller than the inclination angle (the second angle θ2') of the second surface (the front surface 379 of the taper portion 371b) of the first electrode 371. Accordingly, as in the first modification example of the second embodiment shown in FIG. 9, in a case where the side surface 376 of the piezoelectric element 37 is covered with the protective film 392 to the end portion of the third surface of the second electrode 372, the protective film 392 is easier to form than in a case where the end portion of the second electrode 372 is close to a right angle and it is possible to increase the adhesion of the protective film 392, thus, it is possible to suppress cracking in the protective film 392 and to improve the reliability of the piezoelectric device 39. The protective film 392 in FIG. 9 is continuous so as to cover the end portion of the third surface of the second electrode 372 and the fixing portion 362c of the vibration plate 36 via the first surface of the piezoelectric element 37 and the second surface of the first electrode 371. Thus, also in the second embodiment, covering the piezoelectric element 37 and the vibration plate 36 with the protective film 392 in this manner makes it possible to protect the piezoelectric element 37 and the vibration plate 36 from ink, moisture, and the like, thus, it is possible to suppress damage to the piezoelectric element 37 caused by ink, moisture, or the like. In addition, as shown in FIG. 9, even when the protective film 392 is continuous from the end portion of the third surface of the second electrode 372 so as to cover the first surface and the second surface, the gentle inclination of the first surface and the second surface makes it possible to make it difficult for cracks to appear in the protective film 392.

The third angle θ3' of the third surface of the second electrode 372 may be larger than the second angle θ2' of the second surface of the first electrode 371 and may be smaller than the first angle θ1' of the first surface of the piezoelectric layer 373. According to this, since the inclination angle of the side surface 377 of the second electrode 372 with respect to the piezoelectric layer 373 is increased, it is possible to increase the area of the second electrode 372 in the non-inclined portion, thus it is possible to lower the resistance value of the piezoelectric element 37 and to improve the displacement characteristics.

Figure 10:
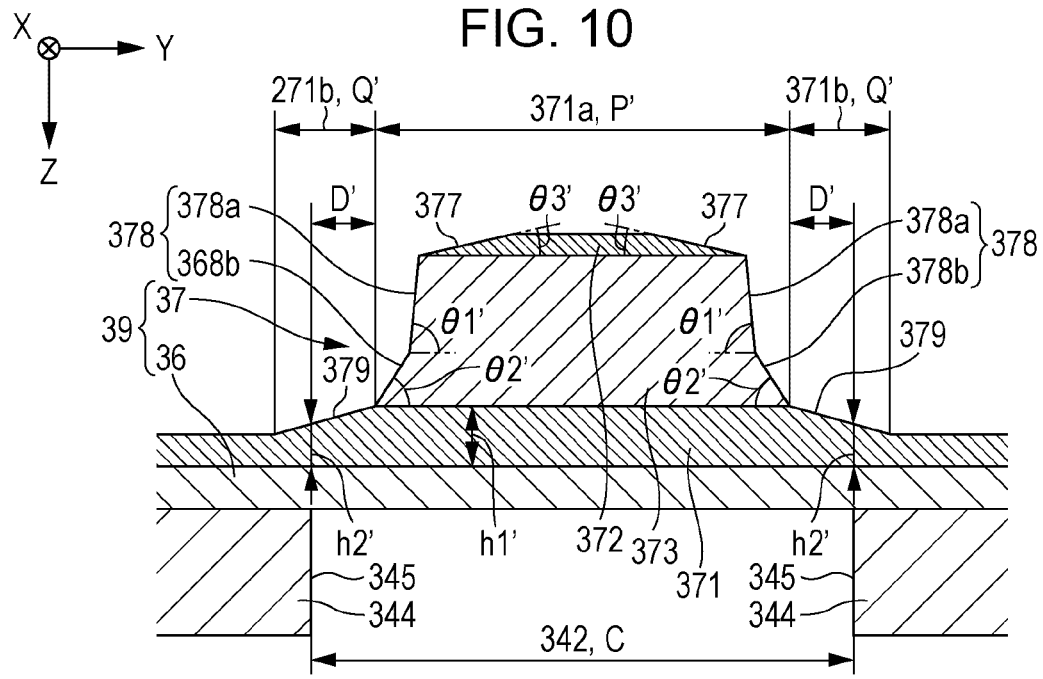
FIG. 10 is a cross-sectional view of a piezoelectric device according to a second modification example of the second embodiment.

In addition, in the configuration of FIG. 8, a case is exemplified in which the side surfaces 378 on the negative side and positive side of the piezoelectric layer 373 in the Y direction are each formed as a single inclined surface, but the invention is not limited thereto, and the side surface 378 of the piezoelectric layer 373 may be formed of a plurality of inclined surfaces each having different inclination angles. For example, in the second modification example of the second embodiment of FIG. 10, a case is exemplified in which the side surfaces 378 on the negative side and positive side in the Y direction are each formed by two inclined surfaces 378a and 378b from the active portion 371a toward the side wall 344 of the pressure chamber C. The inclined surface 378a may be inclined at the first angle θ1' described above with respect to the surface FA (reference surface) on the pressure chamber C side of the vibration plate 36, the inclined surface 378b may be inclined at the second angle θ2' described above with respect to the surface FA (reference surface) on the pressure chamber C side of the vibration plate 36. In such a case, it is possible to set the inclined surface 378a as the first surface and the inclined surface 378b as the second surface. Since forming each of the side surfaces 378 of the piezoelectric element 37 with a plurality of inclined surfaces having different inclination angles in this manner makes it possible to make the changes in the thickness of the piezoelectric device 39 gentle in the vicinity of the boundary where the stress concentration is likely to occur between the piezoelectric element 37 and the vibration plate 36, it is possible to alleviate the stress concentration.

Third Embodiment

Figure 11:
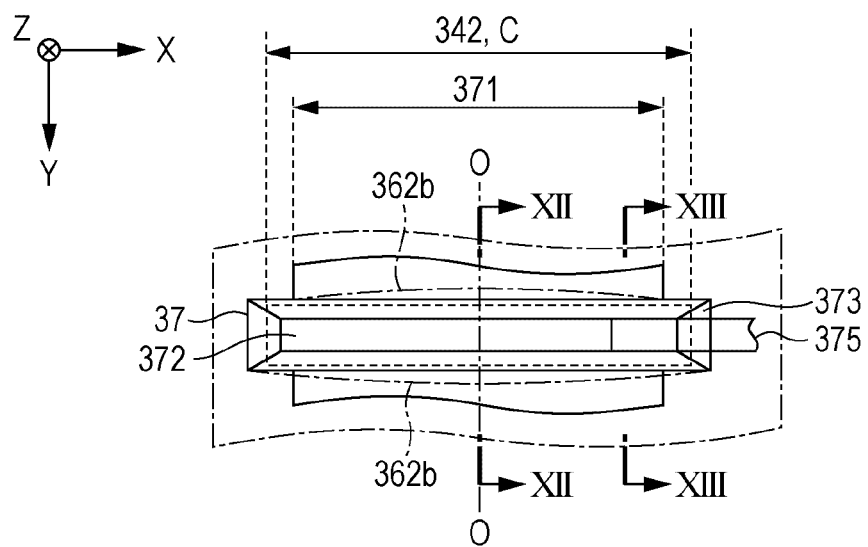
FIG. 11 is a plan view of a piezoelectric device according to a third embodiment.
Figure 12:
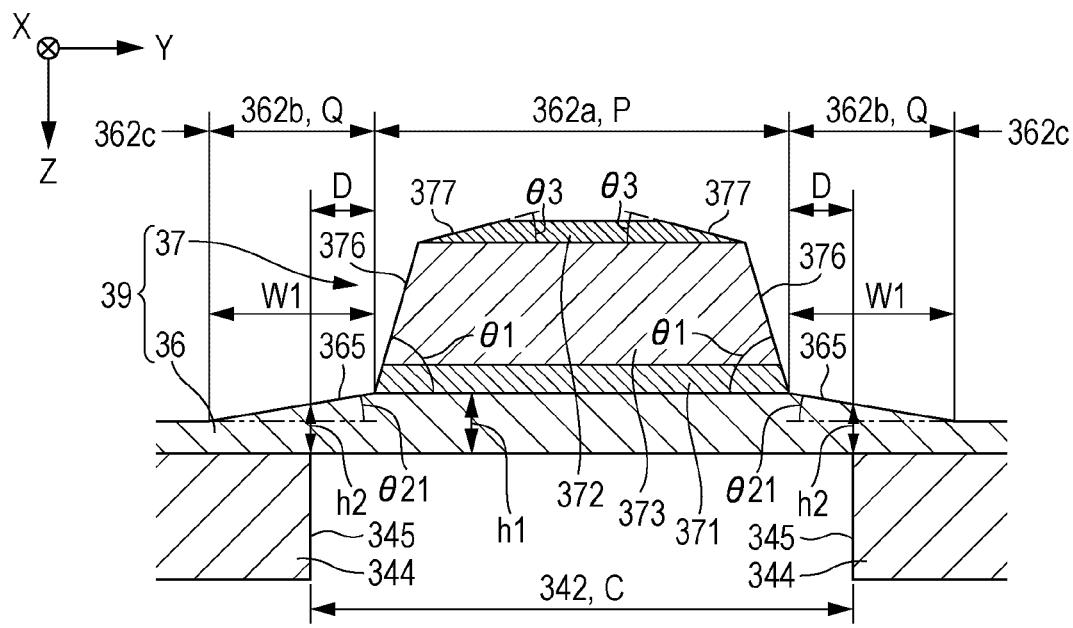
FIG. 12 is a cross-sectional view taken along a line XII-XII of the piezoelectric device shown in FIG. 11.
Figure 13:
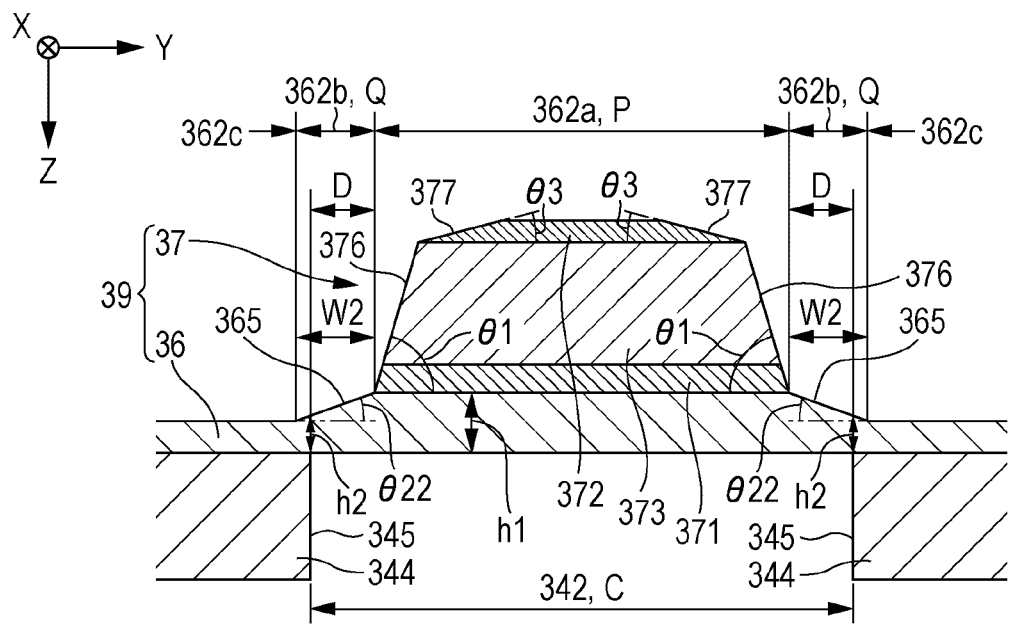
FIG. 13 is a cross-sectional view taken along a line XIII-XIII of the piezoelectric device shown in FIG. 11.

A description will be given of third embodiment of the invention. In the first embodiment, a case was exemplified in which the width of the taper portion 362b of the vibration plate 36 in the Y direction is substantially uniform along the longitudinal direction of the piezoelectric element 37, but in the third embodiment, a case will be exemplified in which the width of the taper portion 362b of the piezoelectric element 37 in the Y direction is different depending on the position of the piezoelectric element 37 in the longitudinal direction. FIG. 11 is a plan view of the piezoelectric device 39 according to the third embodiment. FIG. 12 is a cross-sectional view taken along the XII-XII cross-section of the piezoelectric device 39 shown in FIG. 11, and FIG. 13 is a cross-sectional view taken along the XIII-XIII cross-section of the piezoelectric device 39 shown in FIG. 11.

As shown by the dotted line in FIG. 11, in the vibration plate 36 of the third embodiment, the width of the taper portion 362b (second surface) in the Y direction (second direction) which intersects the X direction (first direction) is larger on the central portion side than the end portion side in the X direction. That is, when the central portion in the Y direction is indicated by O-O line, the width of the taper portion 362b in the Y direction is the maximum in the central portion in the X direction and decreases toward the end portion in the X direction. For example, FIG. 12 is a cross-sectional view taken along the XII-XII cross-section of the line O-O, and FIG. 13 is a cross-sectional view taken along the XIII-XIII cross-section on the end portion side from the central portion (O-O line) in the Y direction. A width W1 of the taper portion 362b in FIG. 12 is larger than a width W2 of the taper portion 362b in FIG. 13.

According to such a configuration, the vibration plate 36 deforms more easily on the central portion side in the X direction than on the end portion side. Therefore, it is possible to improve the displacement characteristics on the central portion side compared to the end portion side in the X direction. In the third embodiment, a case is exemplified in which the width of the taper portion 362b of the vibration plate 36 of the first embodiment changes depending on the position in the longitudinal direction; however, the width of the taper portion 371b of the first electrode 371 of the second embodiment may differ depending on the position in the longitudinal direction. In such a case, for example, as in the third embodiment, it is possible for the width of the taper portion 371b of the first electrode 371 to be larger on the central portion side than on the end portion side in the X direction.

In addition, the inclination angle (second angle θ2) of the front surface 365 (second surface) of the taper portion 362b of the piezoelectric element 37 may be different depending on the position of the piezoelectric element 37 in the longitudinal direction. In the vibration plate 36 of the third embodiment, the inclination angle (second angle θ2) of the taper portion 362b in the Y direction is smaller on the end portion side than on the central portion side in the X direction. That is, the inclination angle (the second angle θ2) of the taper portion 362b is the minimum at the central portion in the X direction and increases toward the end portion in the X direction. For example, the inclination angle (second angle θ21) of the taper portion 362b in FIG. 12 is smaller than the inclination angle (second angle θ22) of the taper portion 362b in FIG. 13.

According to such a configuration, the inclination of the taper portion 362b is gentler on the central portion side in the X direction than on the end portion side. Therefore, it is possible to precisely alleviate the stress concentration on the central portion side, where stress concentration tends to be larger than that on the end portion side in the X direction. In the third embodiment, a case was exemplified in which the inclination angle (second angle θ2) of the taper portion 362b of the vibration plate 36 of the first embodiment changes depending on the position in the longitudinal direction; however, the inclination angle (second angle θ2') of the taper portion 371b of the first electrode 371 of the second embodiment may be different depending on the position in the longitudinal direction. In this case, for example, as in the third embodiment, it is possible to make the inclination angle (second angle θ2') of the taper portion 371b of the first electrode 371 smaller on the central portion side than on the end portion side in the X direction.

Fourth Embodiment

Figure 14:
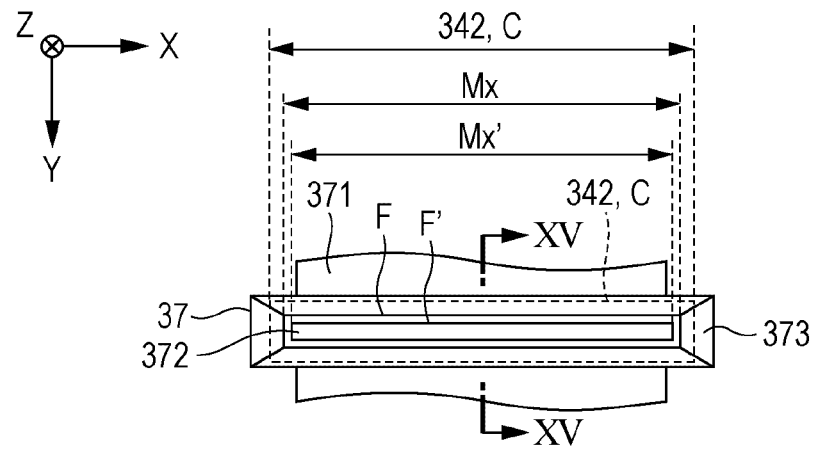
FIG. 14 is a plan view of a piezoelectric device according to a fourth embodiment.
Figure 15:
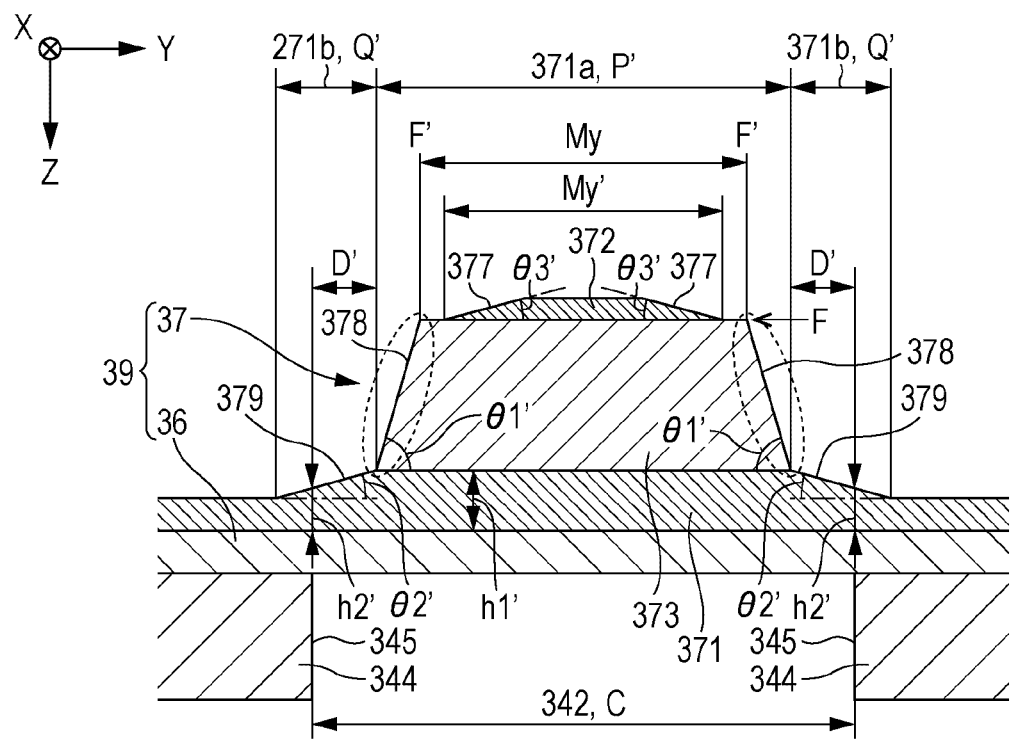
FIG. 15 is a cross-sectional view taken along a line XV-XV of the piezoelectric device shown in FIG. 14.

A description will be given of a fourth embodiment of the invention. FIG. 14 is a plan view of the piezoelectric device 39 according to the fourth embodiment. FIG. 15 is a cross-sectional view taken along the XV-XV cross-section of the piezoelectric device 39 shown in FIG. 14. FIG. 14 and FIG. 15 illustrate a case where the size of the second electrode 372 is changed in the piezoelectric element 37 of FIG. 5. In FIG. 14, the lead electrode 375 is omitted so that the shape of the second electrode 372 is easy to understand.

The second electrode 372 in FIG. 14 and FIG. 15 overlaps the inside from the peripheral portion F' of the front surface F (the front surface on the negative side in the Z direction) on the second electrode 372 side of the piezoelectric layer 373 in a plan view. Specifically, as shown in FIG. 14, the width Mx' of the second electrode 372 in the X direction is smaller than the width Mx of the front surface F of the piezoelectric layer 373 in the X direction, and as shown in FIG. 15, the width My' of the second electrode 372 in the Y direction is smaller than the width M of the front surface F of the piezoelectric layer 373 in the Y direction.

According to the configuration of the fourth embodiment, since the second electrode 372 overlaps the inside from the peripheral portion F' of the front surface F on the second electrode 372 side of the piezoelectric layer 373 in a plan view, it is possible to prevent almost all of the voltage from being applied to the portion of the side surface 378 of the piezoelectric layer 373 (for example, the portion surrounded by the dotted oval in FIG. 15).

The portion of the side surface 378 of the piezoelectric layer 373 is a portion which is likely to be electrically degraded by ion collision in a semiconductor manufacturing step of the piezoelectric element 37 such as ion etching. For example, ions collide directly against the side surface 378 to break the crystal and form a damaged layer, whereby the side surface 378 of the piezoelectric layer 373 is electrically degraded. In addition, when ions collide with the first electrode 371, the conductive material of the first electrode 371 is knocked upward, and the conductive material attaches to the side surface 378. At this time, when a voltage is applied to the side surface 378 of the piezoelectric layer 373, leakage current is generated in a portion to which the conductive material is attached, thereby lowering the electrical reliability.

Therefore, according to the configuration of the fourth embodiment, even if a portion of the side surface 378 of the piezoelectric layer 373 is electrically degraded in a semiconductor manufacturing step such as ion etching, since almost no voltage is applied to the portion of the side surface 378, it is possible to increase the electrical reliability of the piezoelectric element 37.

In the fourth embodiment, the third angle θ3 of the third surface of the second electrode 372 is preferably smaller than the first angle θ1 of the first surface of the piezoelectric element 37. Since it is possible to alleviate more of the stress applied to the end portion of the second electrode 372 as the third angle θ3 is smaller, it is possible to suppress the breakage when the load due to an excessive voltage is applied to the end portion of the second electrode 372. Therefore, it is possible to increase the electrical reliability of the piezoelectric element 37. In particular, in a case of the piezoelectric element 37 requiring high displacement, it is possible to increase the driveable area as the first angle θ1 of the first surface of the piezoelectric layer 373 is larger (closer to 90°) (it is possible to reduce a taper portion which is not driven). In this manner, making the third angle θ3 of the third surface of the second electrode 372 smaller than the first angle θ1 of the first surface of the piezoelectric element 37 makes it possible to obtain the piezoelectric element 37 having high displacement and high reliability.

In addition, in the fourth embodiment, a case is exemplified in which the size of the second electrode 372 is changed in the piezoelectric element 37 having the configuration of FIG. 5; however, the invention is not limited thereto and it is also possible to change the size of the second electrode 372 in the piezoelectric element 37 formed as shown in FIG. 6 to FIG. 13 in the same manner as the fourth embodiment.

Modification Examples

It is possible to make various modifications to the aspects and the embodiments exemplified above. Specific forms of modification example are exemplified below. It is possible to appropriately combine two or more embodiments freely selected from the following examples and the aspects described above within a range consistent with each other.

(1) In the embodiment described above, a serial head is exemplified which reciprocates the carriage 242, on which the liquid ejecting head 26 is mounted, forward and backward in the X direction; however, it is also possible to apply a line head in which the liquid ejecting head 26 is arranged over the entire width of the medium 12 to the invention.

(2) In the embodiment described above, the piezoelectric-type liquid ejecting head 26 using a piezoelectric element which applies mechanical vibration to the pressure chamber is exemplified; however, it is also possible to adopt a thermal-type liquid ejecting head using a heating element which generates air bubbles inside the pressure chamber by heating.

(3) It is possible to adopt the liquid ejecting apparatus 10 exemplified in the embodiment described above in various types of apparatuses such as facsimile machines and copying machines, in addition to apparatuses dedicated to printing. Naturally, the application of the liquid ejecting apparatus 10 of the invention is not limited to printing. For example, a liquid ejecting apparatus which ejects a solution of a coloring material is used as a manufacturing apparatus for forming a color filter of a liquid crystal display device, an organic Electro Luminescence (EL) display, a field emission display (FED), or the like. In addition, a liquid ejecting apparatus for ejecting a solution of a conductive material is used as a manufacturing apparatus for forming wiring and electrodes of a wiring substrate. In addition, the liquid ejecting apparatus is also used as a chip manufacturing apparatus for ejecting a solution of bioorganic matter as a kind of liquid.

What is claimed is:

1. A piezoelectric device comprising:
a pressure chamber;
a piezoelectric element; and
a vibration plate arranged between the pressure chamber and the piezoelectric element and forming a wall surface which intersects a side wall of the pressure chamber,
wherein the piezoelectric element is provided with a first electrode on the vibration plate side, a second electrode on an opposite side of the vibration plate with respect to the first electrode, and a piezoelectric layer interposed between the first electrode and the second electrode,
the vibration plate has a first portion overlapping the piezoelectric element in a plan view and a second portion having a thickness smaller than that of the first portion and overlapping an inner peripheral surface of the side wall of the pressure chamber in a plan view,
a side surface of the piezoelectric element which intersects the vibration plate, has a first surface inclined at a first angle with respect to a surface of the vibration plate on the pressure chamber side,
the vibration plate has a second surface, between the first portion and the second portion, inclined at a second angle smaller than the first angle with respect to the surface of the vibration plate on the pressure chamber side, wherein the second angle is greater than zero degrees, and
an end portion of the second surface of the vibration plate overlaps the side wall of the pressure chamber in a plan view.

2. The piezoelectric device according to claim 1,
wherein the second electrode has a third surface inclined at a third angle with respect to a surface of the vibration plate on the pressure chamber side, and
the third angle is smaller than the second angle.

3. A liquid ejecting head comprising:
the piezoelectric device according to claim 2,
wherein the piezoelectric device changes a pressure of the pressure chamber to eject liquid filled in the pressure chamber from a nozzle.

4. The piezoelectric device according to claim 1,
wherein the second electrode has a third surface inclined at a third angle with respect to a surface of the vibration plate on the pressure chamber side, and
the third angle is larger than the second angle and smaller than the first angle.

5. The piezoelectric device according to claim 1,
wherein the pressure chamber and the piezoelectric element are elongated in a first direction, and a second angle of the second surface is smaller at a central portion side than at an end portion side in the first direction.

6. The piezoelectric device according to claim 1,
wherein the pressure chamber and the piezoelectric element are elongated in a first direction and a width of the second surface in a second direction which intersects the first direction is larger at a central portion side than at an end portion side in the first direction.

7. The piezoelectric device according to claim 1,
wherein the second electrode overlaps inside the piezoelectric layer from a peripheral portion of a surface on the second electrode side in a plan view.

8. The piezoelectric device according to claim 1,
wherein the piezoelectric element and the vibration plate have a protective film.

9. The piezoelectric device according to claim 8,
wherein the protective film is continuous so as to cover the end portion of the second electrode and the first surface.

10. The piezoelectric device according to claim 8,
wherein the protective film is continuous so as to cover an end portion of the second electrode, the second surface, and the first surface.

11. The piezoelectric device according to claim 1,
wherein a portion of the surface of the vibration plate on the pressure chamber side which forms a wall surface of the pressure chamber is flat when the piezoelectric element is not driven.

12. The piezoelectric device according to claim 1,
wherein a portion of the surface of the vibration plate on the pressure chamber side which forms the wall surface of the pressure chamber is bent toward the pressure chamber side of the vibration plate when the piezoelectric element is not driven.

13. A liquid ejecting head comprising:
the piezoelectric device according to claim 1,
wherein the piezoelectric device changes a pressure of the pressure chamber to eject liquid filled in the pressure chamber from a nozzle.

14. A liquid ejecting apparatus comprising:
the piezoelectric device according to claim 1,
wherein the piezoelectric device changes a pressure of the pressure chamber to eject liquid filled in the pressure chamber from a nozzle.

15. A piezoelectric device comprising:
a pressure chamber;
a piezoelectric element; and
a vibration plate arranged between the pressure chamber and the piezoelectric element and forming a wall surface which intersects a side wall of the pressure chamber,
wherein the piezoelectric element is provided with a first electrode on the vibration plate side, a second electrode on an opposite side of the vibration plate with respect to the first electrode, and a piezoelectric layer interposed between the first electrode and the second electrode, the vibration plate has a first portion overlapping the piezoelectric element in a plan view and a second portion having a thickness smaller than that of the first portion and overlapping an inner peripheral surface of the side wall of the pressure chamber in a plan view, and a side surface of the piezoelectric layer which intersects the first electrode has a first surface inclined at a first angle with respect to a surface of the vibration plate on the pressure chamber side and a second surface inclined at a second angle smaller than the first angle, wherein the second angle is greater than zero degrees.

16. A liquid ejecting head comprising:
the piezoelectric device according to claim 15,
wherein the piezoelectric device changes a pressure of the pressure chamber to eject liquid filled in the pressure chamber from a nozzle.

17. A piezoelectric device comprising:
a pressure chamber;
a piezoelectric element; and
a vibration plate arranged between the pressure chamber and the piezoelectric element and forming a wall surface which intersects a side wall of the pressure chamber,
wherein the piezoelectric element is provided with a first electrode on the vibration plate side, a second electrode on an opposite side of the vibration plate with respect to the first electrode, and a piezoelectric layer interposed between the first electrode and the second electrode,
the first electrode has a first portion overlapping the piezoelectric layer in a plan view and a second portion having a thickness smaller than that of the first portion and overlapping an inner peripheral surface of the side wall of the pressure chamber in a plan view,
a side surface of the piezoelectric layer which intersects the first electrode has a first surface inclined at a first angle with respect to a surface of the vibration plate on the pressure chamber side,
the first electrode has a second surface, between the first portion and the second portion, inclined at a second angle smaller than the first angle with respect to a surface of the vibration plate on the pressure chamber side, and
an end portion of the second surface of the vibration plate overlaps the side wall of the pressure chamber in a plan view.

18. A liquid ejecting head comprising:
the piezoelectric device according to claim 17,
wherein the piezoelectric device changes a pressure of the pressure chamber to eject liquid filled in the pressure chamber from a nozzle.

19. A piezoelectric device comprising:
a pressure chamber;
a piezoelectric element; and
a vibration plate arranged between the pressure chamber and the piezoelectric element and forming a wall surface which intersects a side wall of the pressure chamber,
wherein the piezoelectric element is provided with a first electrode on the vibration plate side, a second electrode on an opposite side of the vibration plate with respect to the first electrode, and a piezoelectric layer interposed between the first electrode and the second electrode,
the first electrode has a first portion overlapping the piezoelectric layer in a plan view and a second portion having a thickness smaller than that of the first portion and overlapping an inner peripheral surface of the side wall of the pressure chamber in a plan view, and
a side surface of the piezoelectric layer which intersects the first electrode has a first surface inclined at a first angle with respect to a surface of the vibration plate on the pressure chamber side and a second surface inclined at a second angle smaller than the first angle.

20. A liquid ejecting head comprising:
the piezoelectric device according to claim 19,
wherein the piezoelectric device changes a pressure of the pressure chamber to eject liquid filled in the pressure chamber from a nozzle.

* * * * *